(12) United States Patent
Hashim et al.

(10) Patent No.: US 7,427,218 B1
(45) Date of Patent: Sep. 23, 2008

(54) COMMUNICATIONS CONNECTORS WITH STAGGERED CONTACTS THAT CONNECT TO A PRINTED CIRCUIT BOARD VIA CONTACT PADS

(75) Inventors: Amid I. Hashim, Plano, TX (US); Robert Ray Goodrich, Indianapolis, IN (US)

(73) Assignee: CommScope, Inc. of North Carolina, Hickory, NC (US)

( * ) Notice: Subject to any disclaimer, the term of this patent is extended or adjusted under 35 U.S.C. 154(b) by 0 days.

(21) Appl. No.: 11/752,521

(22) Filed: May 23, 2007

(51) Int. Cl.
 H01R 24/00 (2006.01)
(52) U.S. Cl. .................................. 439/676
(58) Field of Classification Search ............. 439/676, 439/941
See application file for complete search history.

(56) References Cited

U.S. PATENT DOCUMENTS

| | | | |
|---|---|---|---|
| 5,186,647 A | 2/1993 | Denkmann et al. | 439/395 |
| 5,674,093 A | 10/1997 | Vaden | 439/676 |
| 5,779,503 A | 7/1998 | Tremblay et al. | 439/676 |
| 5,911,602 A | 6/1999 | Vaden | 439/676 |
| 5,997,358 A | 12/1999 | Adriaenssens et al. | 439/676 |
| 6,079,996 A | 6/2000 | Arnett | 439/188 |
| 6,086,428 A | 7/2000 | Pharney et al. | 439/676 |
| 6,102,722 A | 8/2000 | Arnett | 439/189 |
| 6,116,964 A | 9/2000 | Goodrich et al. | 439/676 |
| 6,120,329 A | 9/2000 | Steinman | 439/676 |
| 6,139,371 A | 10/2000 | Troutman et al. | 439/676 |
| 6,186,834 B1 * | 2/2001 | Arnett et al. | 439/676 |
| 6,196,880 B1 * | 3/2001 | Goodrich et al. | 439/676 |
| 6,350,158 B1 | 2/2002 | Arnett et al. | 439/676 |
| 6,368,144 B2 | 4/2002 | Viklund | 439/418 |
| 6,443,777 B1 * | 9/2002 | McCurdy et al. | 439/676 |
| 6,464,541 B1 * | 10/2002 | Hashim et al. | 439/676 |
| 6,530,810 B2 | 3/2003 | Goodrich et al. | 439/676 |
| 6,547,604 B2 | 4/2003 | Arnett et al. | 439/676 |
| 6,558,207 B1 * | 5/2003 | Pepe et al. | 439/862 |
| 6,641,443 B1 * | 11/2003 | Itano et al. | 439/676 |
| 6,736,681 B2 * | 5/2004 | Arnett | 439/676 |
| 6,767,257 B2 * | 7/2004 | Arnett et al. | 439/676 |
| 6,786,776 B2 * | 9/2004 | Itano et al. | 439/676 |
| 7,166,000 B2 * | 1/2007 | Pharney | 439/676 |
| 7,168,993 B2 * | 1/2007 | Hashim | 439/676 |
| 7,182,649 B2 * | 2/2007 | Caveney et al. | 439/676 |
| 7,265,300 B2 * | 9/2007 | Adriaenssens et al. | 174/258 |

(Continued)

Primary Examiner—Ross N Gushi
(74) Attorney, Agent, or Firm—Myers Bigel Sibley & Sajovec

(57) ABSTRACT

Communications connectors having a plurality of signal carrying paths are provided that include a printed circuit board and a plurality of contacts. The printed circuit board includes a plurality of contact pads, a plurality of output terminals, and a plurality of conductive paths that connect at least some of the contact pads to respective ones of the output terminals. Each contact includes a plug contact region, a pad contact region, and a signal carrying segment that connects the plug contact region and the pad contact region. A first of the signal carrying paths extends from the plug contact region of a first of the contacts to a first of the output terminals. This signal carrying path includes the signal carrying segment of the first of the contacts, a first of the contact pads and a first of the conductive paths. Moreover, the signal carrying segment of the first of the contacts is staggered with respect to the signal carrying segment of another of the contacts that is directly adjacent to the first of the contacts.

20 Claims, 12 Drawing Sheets

U.S. PATENT DOCUMENTS

| | | | |
|---|---|---|---|
| 7,341,493 B2 * | 3/2008 | Pepe et al. | 439/676 |
| 2003/0129880 A1 * | 7/2003 | Arnett et al. | 439/676 |
| 2003/0216083 A1 * | 11/2003 | Viklund et al. | 439/676 |
| 2004/0067693 A1 * | 4/2004 | Arnett | 439/676 |
| 2004/0102100 A1 * | 5/2004 | Funatsu et al. | 439/676 |
| 2004/0127105 A1 * | 7/2004 | Itano et al. | 439/676 |
| 2005/0095920 A1 * | 5/2005 | Aekins et al. | 439/676 |
| 2005/0136747 A1 * | 6/2005 | Caveney et al. | 439/676 |
| 2005/0181676 A1 * | 8/2005 | Caveney et al. | 439/676 |
| 2005/0254223 A1 * | 11/2005 | Hashim et al. | 361/793 |
| 2006/0019549 A1 * | 1/2006 | Ciezak et al. | 439/676 |
| 2006/0121793 A1 * | 6/2006 | Pharney | 439/676 |
| 2006/0134992 A1 * | 6/2006 | Green et al. | 439/676 |
| 2006/0148325 A1 * | 7/2006 | Hashim | 439/676 |
| 2007/0015414 A1 * | 1/2007 | Denovich et al. | 439/676 |
| 2007/0015417 A1 * | 1/2007 | Caveney et al. | 439/676 |
| 2007/0059988 A1 * | 3/2007 | Bolouri-Saransar | 439/676 |
| 2007/0123112 A1 * | 5/2007 | Caveney et al. | 439/676 |
| 2007/0184724 A1 * | 8/2007 | Adriaenssens et al. | 439/676 |
| 2007/0212946 A1 * | 9/2007 | Bert et al. | 439/676 |
| 2007/0254529 A1 * | 11/2007 | Pepe et al. | 439/676 |
| 2007/0259571 A1 * | 11/2007 | Chen | 439/676 |
| 2007/0270043 A1 * | 11/2007 | Pepe et al. | 439/676 |
| 2008/0009199 A1 * | 1/2008 | Hashim | 439/676 |
| 2008/0020652 A1 * | 1/2008 | Caveney et al. | 439/676 |
| 2008/0045090 A1 * | 2/2008 | Caveney | 439/676 |

* cited by examiner

COMMUNICATIONS CONNECTORS WITH STAGGERED CONTACTS THAT CONNECT TO A PRINTED CIRCUIT BOARD VIA CONTACT PADS

FIELD OF THE INVENTION

The present invention relates generally to communications connectors and, more particularly, to communications connectors that include contacts and a printed circuit board.

BACKGROUND

In an electrical communications system, it is sometimes advantageous to transmit information signals (e.g., video, audio, data) over a pair of conductors (hereinafter "conductor pair" or "differential pair") rather than over a single conductor. The conductors may comprise, for example, wires, contacts, wiring board traces, conductive vias, other electrically conductive elements and/or combinations thereof. The signals transmitted on each conductor of the differential pair have equal magnitudes, but opposite phases, and the information signal is embedded as the voltage difference between the signals carried on the two conductors. This transmission technique is generally referred to as "balanced" transmission. When a signal is transmitted over a conductor, electrical noise from external sources such as lightning, electronic equipment and devices, automobile spark plugs, radio stations, etc. may be picked up by the conductor, degrading the quality of the signal carried by the conductor. With balanced transmission techniques, each conductor in a differential pair often picks up approximately the same amount of noise from these external sources. Because approximately an equal amount of noise is added to the signals carried by both conductors of the differential pair, the information signal is typically not disturbed, as the information signal is extracted by taking the difference of the signals carried on the two conductors of the differential pair, and thus the noise signal may be substantially cancelled out by the subtraction process.

Many communications systems include a plurality of differential pairs. For example, the typical telephone line includes two differential pairs (i.e., a total of four conductors). Similarly, high speed communications systems that are used to connect computers and/or other processing devices to local area networks and/or to external networks such as the Internet typically include four differential pairs. In such systems, the conductors of the multiple differential pairs are usually bundled together within a cable and thus necessarily extend in the same direction for some distance. Unfortunately, when multiple differential pairs are bunched closely together, another type of noise referred to as "crosstalk" may arise.

"Crosstalk" refers to signal energy from a conductor of one differential pair that is picked up by a conductor of another differential pair in the communications system. "Crosstalk" includes both near-end crosstalk, or "NEXT", which is the crosstalk measured at an input location corresponding to a source at the same location (i.e., crosstalk whose power travels in an opposite direction to that of an originating, disturbing signal in a different path), as well as far-end crosstalk, or "FEXT", which is the crosstalk measured at the output location corresponding to a source at the input location (i.e., crosstalk whose power travels in the same direction as the disturbing signal in the different path). Both NEXT and FEXT are undesirable signals that interfere with the information signal.

A variety of techniques may be used to reduce crosstalk in communications systems such as, for example, tightly twisting the paired conductors (which are typically insulated copper wires) in a cable, whereby different pairs are twisted at different rates that are not harmonically related, so that each conductor in the cable picks up approximately equal amounts of signal energy from the two conductors of each of the other differential pairs included in the cable. If this condition can be maintained, then the crosstalk noise may be significantly reduced, as the conductors of each differential pair carry equal magnitude, but opposite phase signals such that the crosstalk added by the two conductors of a differential pair onto the other conductors in the cable tends to cancel out.

While such twisting of the conductors and/or various other known techniques may substantially reduce crosstalk in cables, most communications systems include both cables and communications connectors that interconnect the cables and/or connect the cables to computer hardware. Unfortunately, the communications connector configurations that were adopted years ago generally did not maintain the conductors of each differential pair a uniform distance from the conductors of the other differential pairs in the connector hardware. Moreover, in order to maintain backward compatibility with connector hardware that is already in place in existing homes and office buildings, the connector configurations have, for the most part, not been changed. As such, the conductors of each differential pair tend to induce unequal amounts of signal energy on each of the other conductors in current and pre-existing connectors. As a result, many current connector designs generally introduce some amount of NEXT and FEXT crosstalk.

FIG. 1 depicts an exemplary electrical communications system in which crosstalk is likely to occur. As shown in FIG. 1, a computer 101 is connected by a cable 102 to a modular jack 105 that is mounted in a wall plate 109. The cable 102 is a patch cord that includes a modular plug 103, 103' at each end thereof and which contains a plurality (typically four) of differential pairs. Modular plug 103 inserts into a modular jack (not pictured in FIG. 1) provided in the back of the computer 101, and modular plug 103' inserts into an opening 106 in the front side of the modular jack 105 so that the blades of the plug 103' mate with respective contacts of the jack 105. In this manner, information signals may be communicated from the computer 101 to the modular jack 105. The modular jack 105 includes a connector assembly 107 at the back end thereof that receives and holds wires from a second cable 108 that are individually pressed into slots in the connector assembly 107 to make mechanical and electrical connection. The second cable 108 may connect the computer 101 to, for example, network equipment (not shown) thus enabling it to access a local area network (LAN) and/or the Internet (both not shown).

Pursuant to certain industry standards (e.g., the TLA/EIA-568-B.2-1 standard approved Jun. 20, 2002 by the Telecommunications Industry Association), the communication system of FIG. 1 may include a total of eight conductors 1-8 that comprise four differential pairs. By convention, the conductors of each differential pair are often referred to as a "tip" conductor and a "ring" conductor. The industry standards specify that, at the plug-jack mating point, the eight conductors are aligned in a row, with the four differential pairs specified as depicted in FIG. 2. As known to those of skill in the art, under the TIA/EIA 568, type B configuration, conductor 5 in FIG. 2 comprises the tip conductor of pair 1, conductor 4 comprises the ring conductor of pair 1, conductor 1 comprises the tip conductor of pair 2, conductor 2 comprises the ring conductor of pair 2, conductor 3 comprises the tip conductor of pair 3, conductor 6 comprises the ring conductor of pair 3, conductor 7 comprises the tip conductor of pair 4, and conductor 8 comprises the ring conductor of pair 4.

As shown in FIG. 2, in at least the connection region where the contacts (blades) of the modular plug 103' (see FIG. 1) mate with the contacts of the modular jack 105, the conductors of the differential pairs are not equidistant from the conductors of the other differential pairs. By way of example, conductor 2 (i.e., the ring conductor of pair 2) is closer to conductor 3 (i.e., the tip conductor of pair 3) than is conductor 1 (i.e., the tip conductor of pair 2) to conductor 3. Consequently, differential capacitive and/or inductive coupling occurs between the conductors of pairs 2 and 3 that generate both NEXT and FEXT. Similar differential coupling occurs with respect to the other differential pairs in the modular plug 103' and the modular jack 105.

U.S. Pat. No. 5,997,358 to Adriaenssens et al. (hereinafter "the '358 patent") describes multi-stage schemes for compensating NEXT for a plug-jack combination. The entire contents of the '358 patent are hereby incorporated herein by reference as if set forth fully herein. The connectors described in the '358 patent can reduce the "offending" NEXT that may be induced from the conductors of a first differential pair onto the conductors of a second differential pair in, for example, the contact region where the blades of a modular plug mate with the contacts of a modular jack. Pursuant to the teachings of the '358 patent, a "compensating" crosstalk may be deliberately added, usually in the jack, that reduces or substantially cancels the offending crosstalk at the frequencies of interest. As discussed in the '358 patent, two or more stages of NEXT compensation may be provided, where the magnitude and phase of the compensating crosstalk signal induced by each stage, when combined with the compensating crosstalk signals from the other stages, provide a composite compensating crosstalk signal that substantially cancels the offending crosstalk signal over a frequency range of interest. The multi-stage (i.e., two or more) compensation schemes disclosed in the '358 patent can be more efficient at reducing the NEXT tlan schemes in which the compensation is added at a single stage, especially when the second and subsequent stages of compensation include a time delay that is selected and/or controlled to account for differences in phase between the offending and compensating crosstalk signals.

The applicable industry standards for connector crosstalk performance are generally specified in terms of NEXT and FEXT performance, and the required performance levels are usually specified for mated plug and jack combinations with the input terminals of the plug used as a reference plane. For example, communication channels using unshielded twisted pairs (UTP) of copper wire are often expected to at least meet industry "Category 6" standards which require at, for example, 100 MHz at least 54 dB NEXT loss and 43 dB FEXT loss with respect to any two signal paths through the mated connectors (i.e., the magnitude of the NEXT signal induced on any other differential pair when a first differential pair is excited must be at least 54 dB below the magnitude of the signal on the first differential pair at 100 MHz, and the magnitude of the FEXT signal induced on any other differential pair when a first differential pair is excited must be at least 43 dB below the magnitude of the signal on the first differential pair at 100 MHz). While the multi-stage compensation schemes according to embodiments of the '358 patent can allow connectors to meet the "Category 6" performance standards set forth in TIA/EIA 568B.2-1 standard, methods and systems for even further reducing the levels of NEXT and FEXT are desired.

SUMMARY

Pursuant to embodiments of the present invention, communications connectors having a plurality of signal carrying paths are provided that include a printed circuit board and a plurality of contacts. The printed circuit board includes a plurality of contact pads, a plurality of output terminals, and a plurality of conductive paths that electrically connect at least some of the contact pads to respective ones of the output terminals. Each contact includes a plug contact region, a pad contact region, and a signal carrying segment that connects the plug contact region and the pad contact region. A first of the signal carrying paths extends from the plug contact region of a first of the contacts to a first of the output terminals. This signal carrying path includes the signal carrying segment of the first of the contacts, a first of the contact pads and a first of the conductive paths. Moreover, the signal carrying segment of the first of the contacts is staggered with respect to the signal carrying segment of another of the contacts that is directly adjacent to the first of the contacts. In some embodiments, the connector may include a housing, and each of the plurality of contacts may include a mounted end that is mounted in the housing.

In some embodiments of these connectors, the pad contact region of each of the contacts may be located between a free-end of the contact and the plug contact region. Moreover, each the contacts may include a mounted end that is mounted in a metal-plated hole in the printed circuit board, and the printed circuit board may include a compensation circuit that is electrically connected by respective conductive traces to at least two of the plurality of metal-plated holes. The compensating crosstalk introduced by this compensation circuit may have substantially no delay relative to the plug contact region.

The pad contact region of each of the contacts may be part of an undulation region of the contact. In some embodiments, each of the contacts may include a mounted end that is mounted in an opening in a first surface of the printed circuit board, an intermediate segment that wraps around the printed circuit board, and a free end portion that extends above a second surface of the printed circuit board that is opposite the first surface. Moreover, the connector may also include a second plurality of contacts. Each of these second plurality of contacts may include a mounted end that is mounted in one of a second plurality of metal-plated holes in the second surface of the printed circuit board.

Pursuant to further embodiments of the present invention, communications connectors are provided that include a plurality of signal carrying paths that connect a plurality of input terminals to respective ones of a plurality of output terminals. These connectors include a printed circuit board that has a plurality of wire connection terminals mounted therein and a plurality of contacts, each of which has a mounted end that is mounted in the printed circuit board, a free end, and a plug contact region. The plug contact regions each comprise one of the plurality of input terminals and each wire connection terminal comprises one of the plurality of output terminals. In these connectors, at least some of the mounted ends comprise branches off of respective ones of the plurality of signal carrying paths. Moreover, a signal carrying segment of the first of the plurality of contacts is staggered with respect to the signal carrying segment of one of the plurality of contacts that is directly adjacent to the first of the plurality of contacts.

In some embodiments, the mounted end of each contact is mounted in a respective one of a plurality of metal-plated holes in the printed circuit board, and a crosstalk compensation circuit is connected to at least some of the metal-plated holes. The printed circuit board may include a plurality of contact pads, and each of the contacts may include a pad contact region that is configured to mate with a respective one of the contact pads. Each contact may include a free end, and the pad contact region of each contact may be between the plug contact region of the contact and the free end of the contact. Moreover, each contact may wrap around the printed circuit board.

Pursuant to still further embodiments of the present invention, modular jacks are provided that include a printed circuit board that has a plurality of contact pads, a plurality of output terminals, and a plurality of conductive paths that electrically connect at least some of the plurality of contact pads to respective ones of the plurality of output terminals. These connectors also include a plurality of contacts, each contact having a mounted end, a free end and an intermediate segment extending between the mounted end and the free end. Each of the plurality of contact pads are mounted to make electrical contact with the intermediate segment of respective ones of the plurality of contacts when a plug is mated with the modular jack. Moreover, the intermediate segment of a first of the plurality of contacts is staggered with respect to the intermediate segment of a second of the plurality of contacts that is immediately adjacent the first of the plurality of contacts.

In these jacks, the intermediate segment of each contact may include a plug contact region, and the plurality of contact pads may make electrical contact with the respective ones of the plurality of contacts in between the plug contact region of each contact and the free end of each contact. The mounted end of each of the plurality of contacts may be mounted in respective ones of a plurality of metal-plated holes in the printed circuit board, and the printed circuit board includes a compensation circuit that is electrically connected by respective conductive traces to at least two of the plurality of metal-plated holes.

Pursuant to further embodiments of the present invention, communications connectors are provided that have a jack housing that includes a plug aperture, a printed circuit board, and a plurality of jackwire contacts mounted on the printed circuit board. Each of the jackwire contacts includes a plug contact region that is configured to mate with a respective contact of a mating plug that is received within the plug aperture. These connectors further include a first deflectable contact that is mounted on the printed circuit board and that is configured to make contact with a first of the jackwire contacts when a mating plug is received within the plug aperture. The first deflectable contact is also electrically connected to a first trace on the printed circuit board.

The first deflectable contact may protrude over an edge of the printed circuit board. The mounted end of the first of the jackwire contacts may extend from a top surface of the printed circuit board, and a distal end of the first of the jackwire contacts is below the top surface of the printed circuit board when a mating plug is received within the plug aperture. A signal carrying path associated with the first of the jackwire contacts may extend through at least part of the first deflectable contact.

A fixed end of the first deflectable contact may be fixed in a first surface of the printed circuit board, and a distal end of the first deflectable contact may be configured to be deflected below the first surface of the printed circuit board when a mating plug is received within the plug aperture. The connector may also include a second deflectable contact that is mounted on the printed circuit board and that is configured to make contact with a second of the jackwire contacts when a mating plug is received within the plug aperture. The connector may include a total of eight jackwire contacts, and the first and second of the jackwire contacts may have respective plug contact regions that sandwich the plug contact regions of the remaining six of the plurality of jackwire contacts. Moreover, the first of the jackwire contacts may make physical contact with the first deflectable contact forward of a front edge of the printed circuit board when a mating plug is received within the plug aperture.

DETAILED DESCRIPTION

Figure 1:
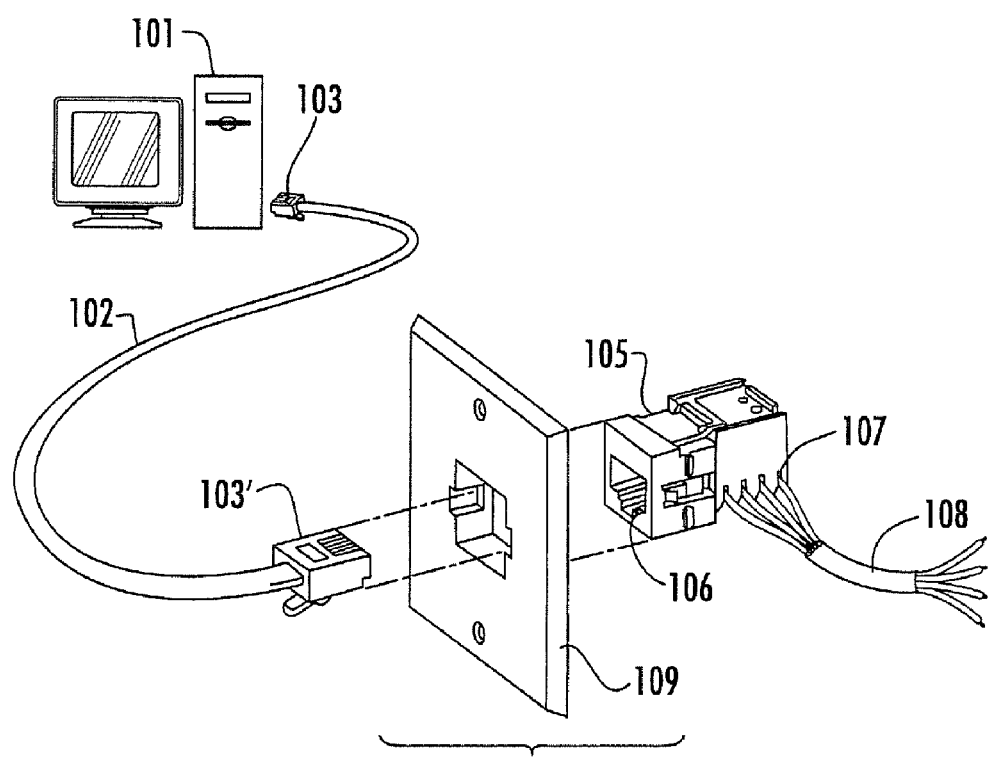
FIG. 1 illustrates the use of modular plug and modular jack connectors to interconnect a computer with a communications cable.

The present invention will be described more particularly hereinafter with reference to the accompanying drawings. The invention is not intended to be limited to the illustrated embodiments; rather, these embodiments are intended to fully and completely disclose the invention to those skilled in this art. In the drawings, like numbers refer to like elements throughout. Thicknesses and dimensions of some components may be exaggerated for clarity.

Spatially relative terms, such as "under", "below", "lower", "over", "upper", "top", "bottom" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Well-known functions or constructions may not be described in detail for brevity and/or clarity. As used herein the expression "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including" when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

This invention is directed to communications connectors, with a primary example of such being a communications jack (e.g., a modular jack, a patch panel jack, etc.). As used herein, the terms "forward", "forwardly", and "front" and derivatives thereof refer to the direction defined by a vector extending from the center of the jack toward the plug opening of the jack. Conversely, the terms "rearward", "rearwardly", and derivatives thereof refer to the direction directly opposite the forward direction; the rearward direction is defined by a vector that extends away from the plug opening toward the remainder of the jack. Where used, the terms "attached", "connected", "interconnected" "contacting", "mounted" and the like can mean either direct or indirect attachment or contact between elements, unless stated otherwise.

Figure 3:
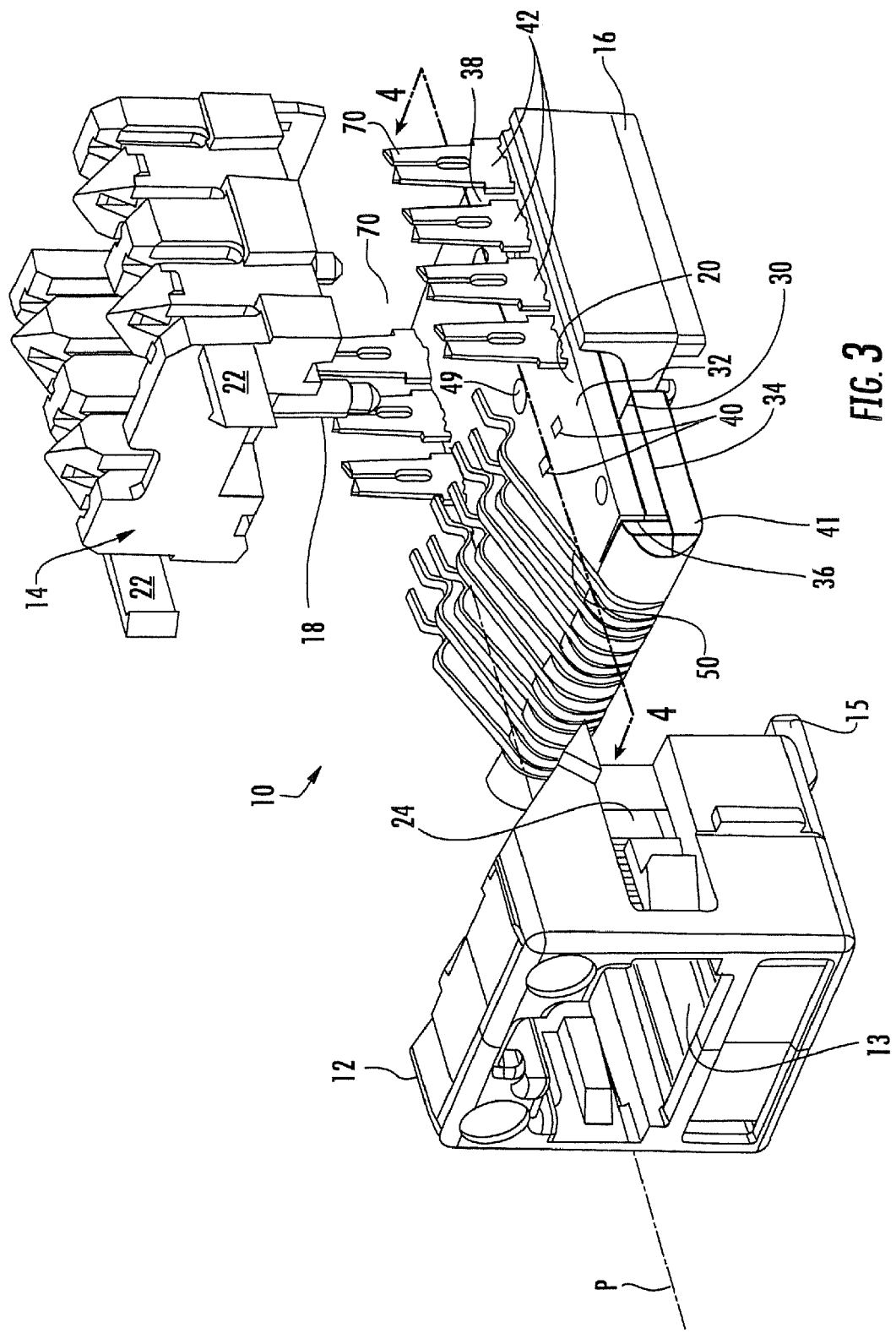
FIG. 3 is an exploded perspective view of a communications connector according to certain embodiments of the present invention.
Figure 4:
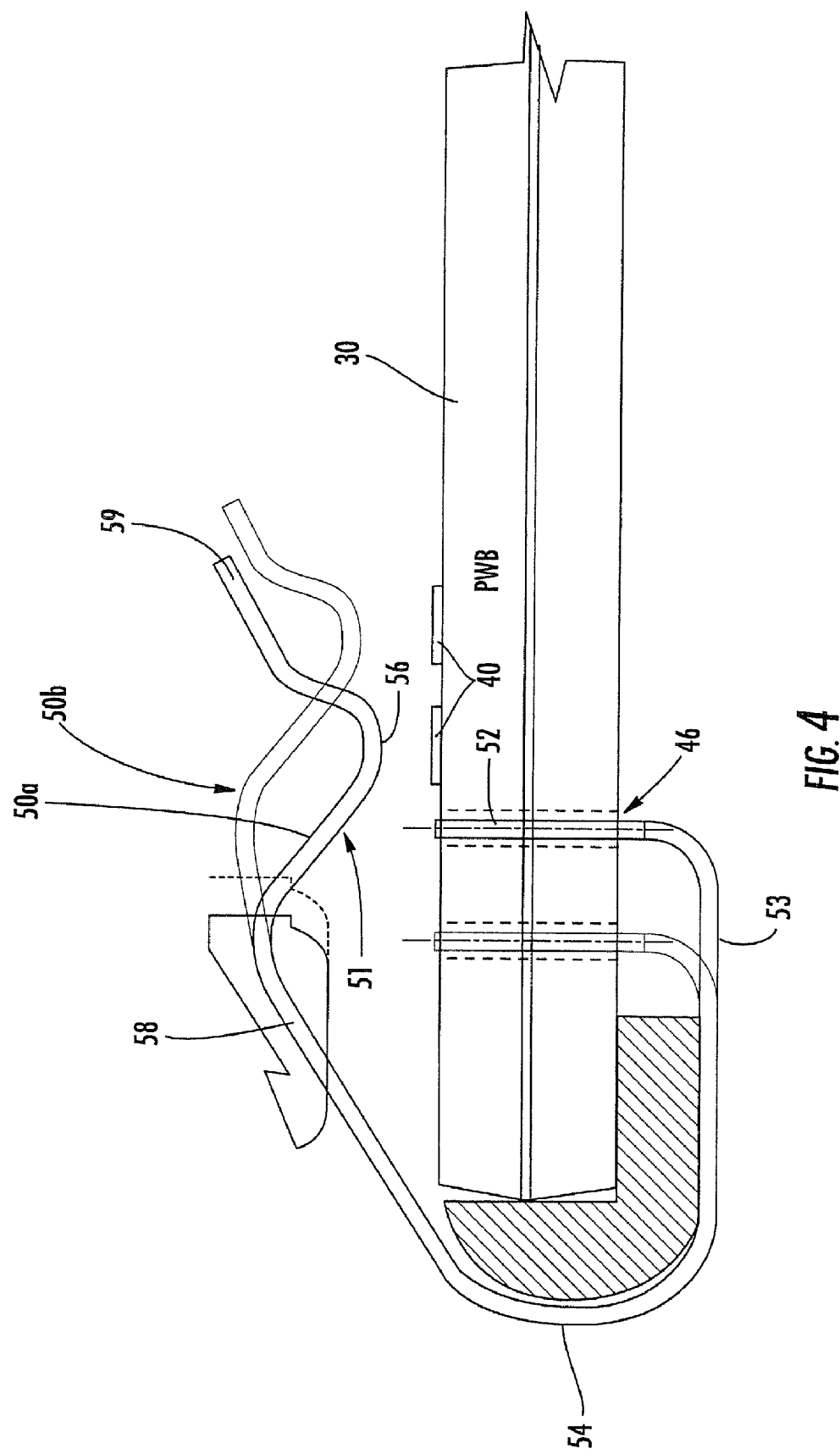
FIG. 4 is a side view, taken along the line 4-4 of FIG. 3, of the printed circuit board and jackwire contacts of the communications connector of FIG. 3.
Figure 5:
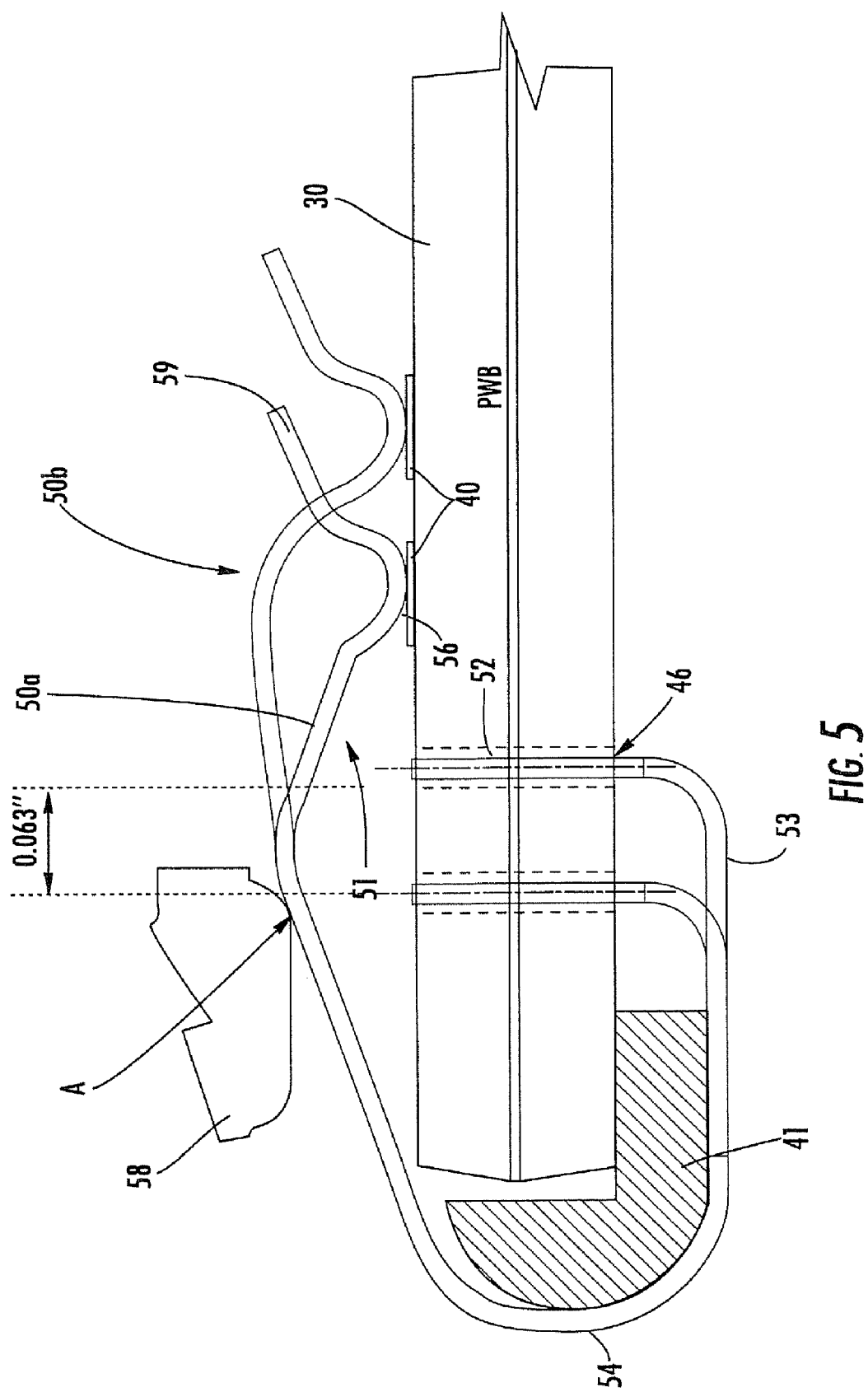
FIG. 5 is a side view, taken along the line 4-4 of FIG. 3, of the printed circuit board and jackwire contacts of the communications connector of FIG. 3 that shows how the jackwire contacts deflect when a mating plug is received within the communications connector.
Figure 6:
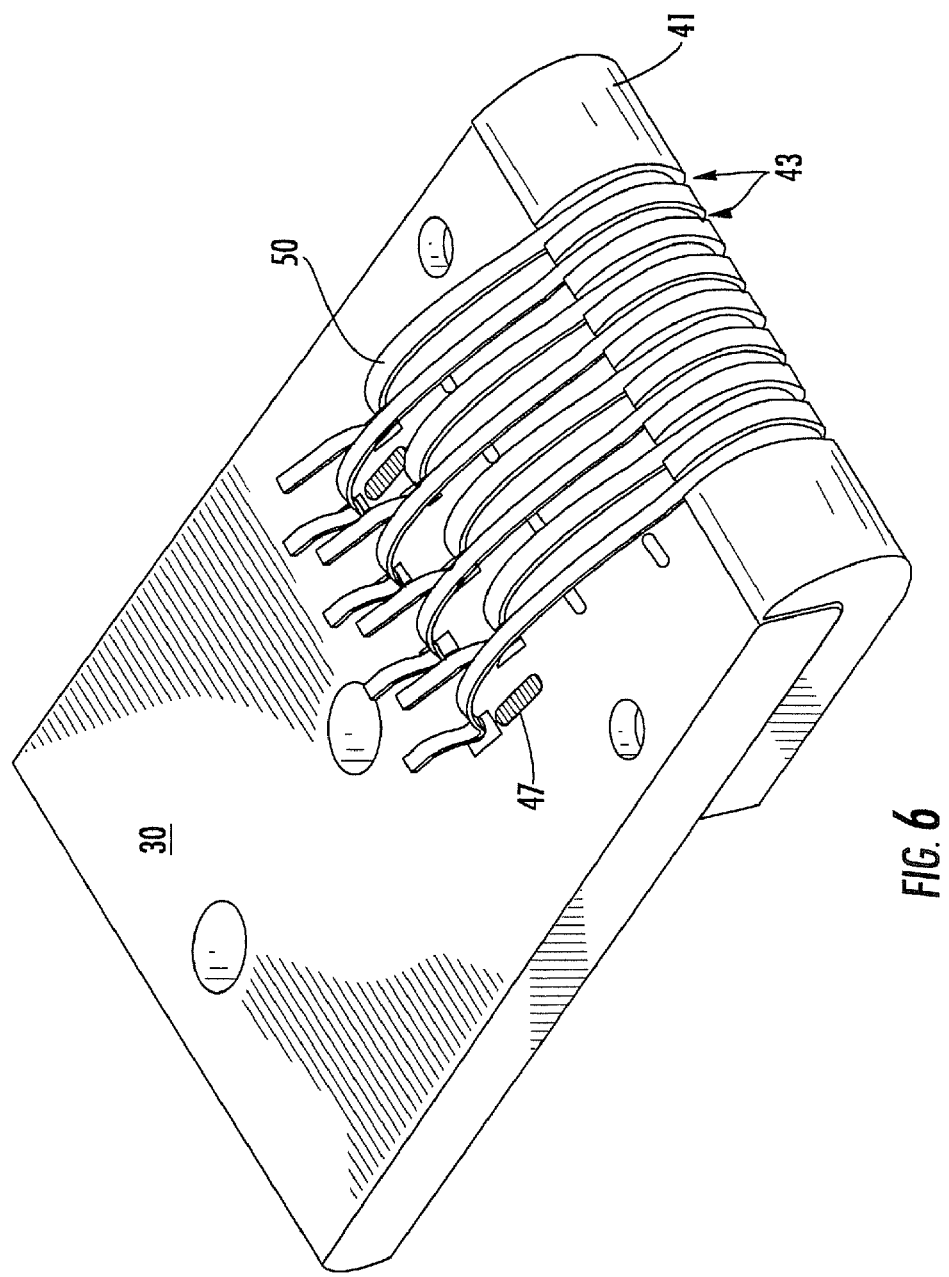
FIG. 6 is a perspective view of the printed circuit board and jackwire contacts of the communications connector of FIG. 3.
Figure 7:
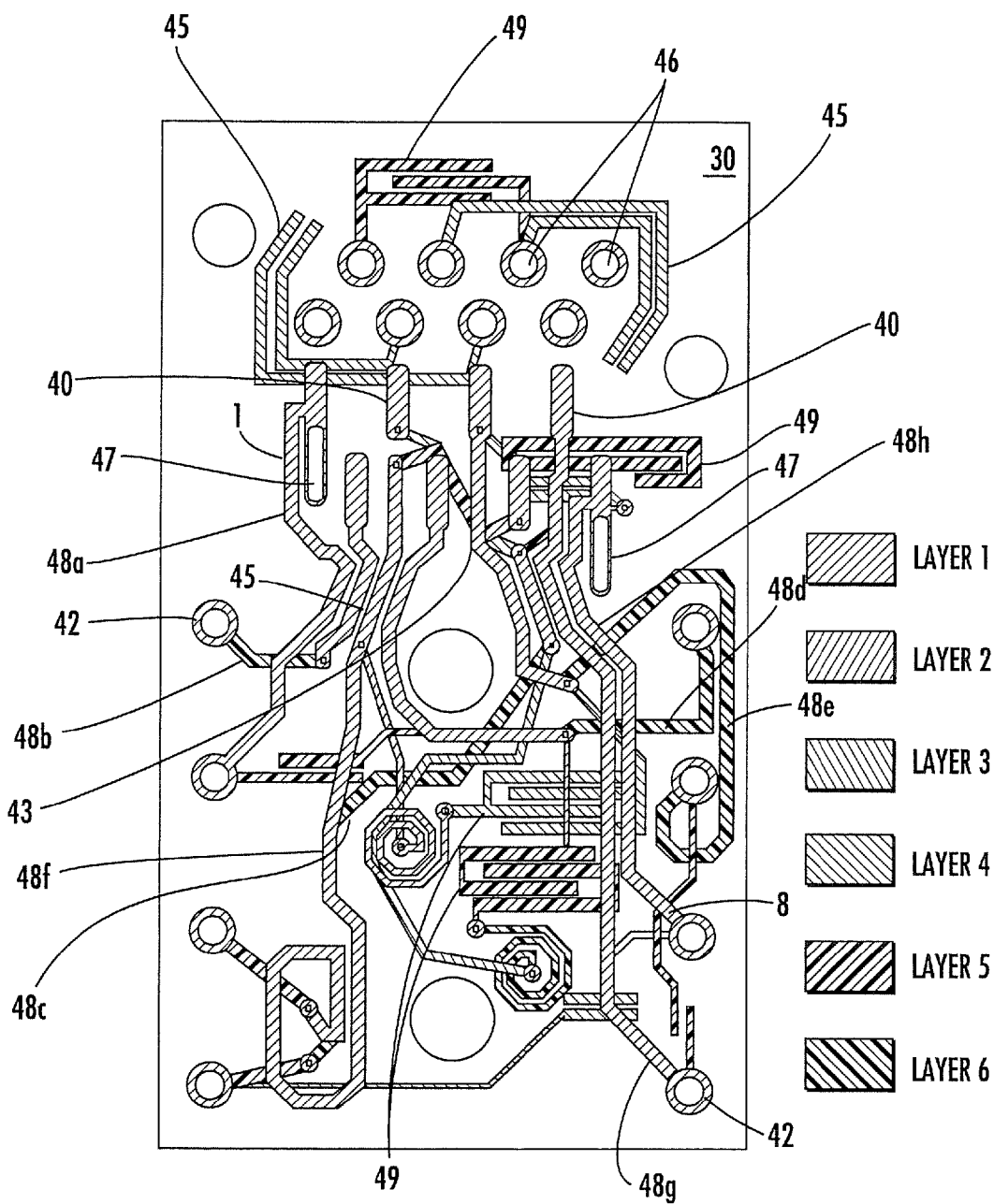
FIG. 7 is a plan view of the printed circuit board of FIG. 3 with the traces for each layer illustrated with different cross-hatching.
Figure 8:
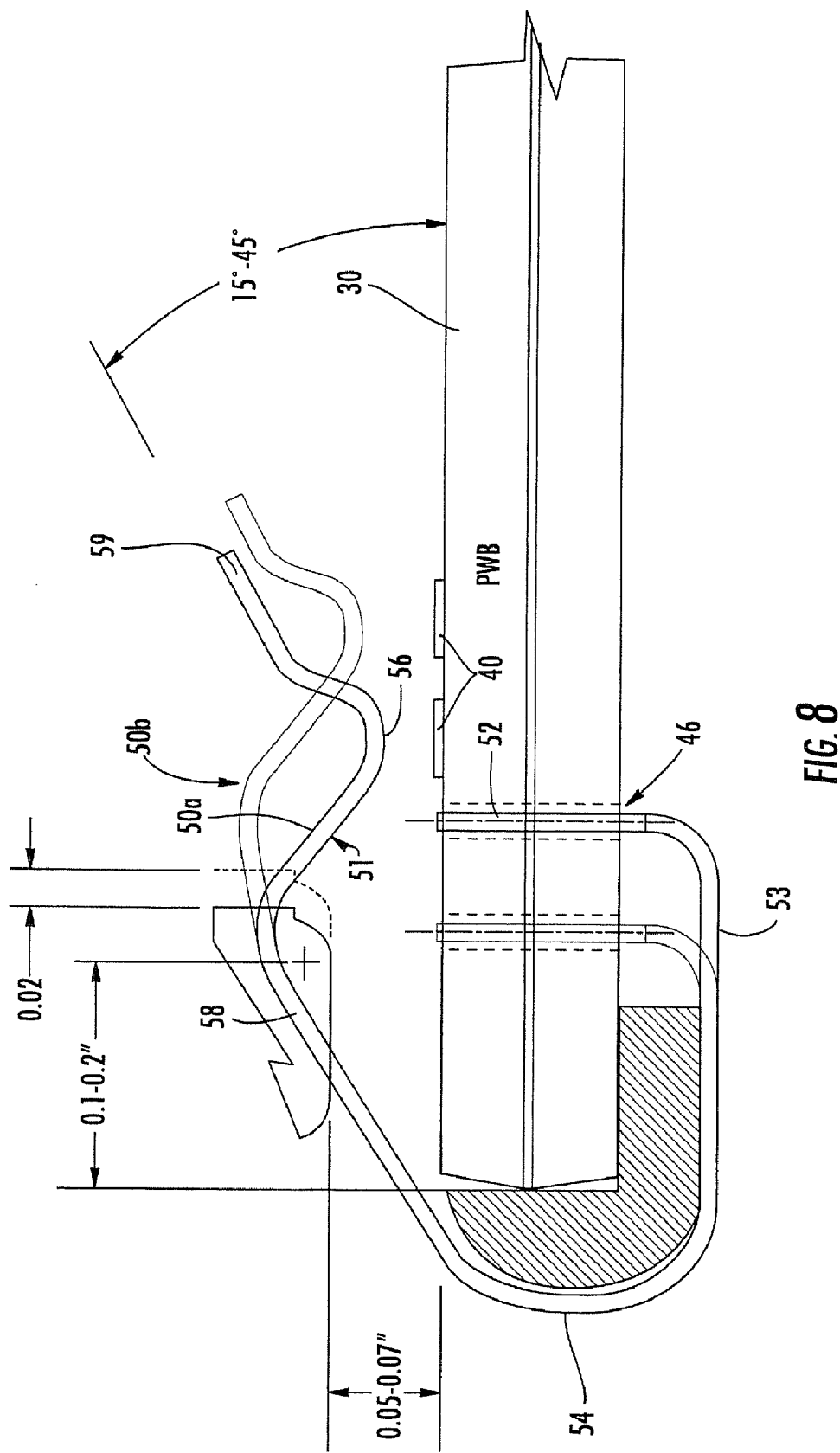
FIG. 8 is a side view, taken along the line 4-4 of FIG. 3, of the printed circuit board and jackwire contacts of the communications connector of FIG. 3 with dimensions of various elements according to certain embodiments of the present invention depicted.

FIG. 3 is an exploded perspective view of a communications connector 10 according to embodiments of the present invention. FIG. 4 is a side view, taken along the line 4-4 of FIG. 3, of the printed circuit board and jackwire contacts of the communications connector 10. FIG. 5 is a side view, also taken along the line 4-4 of FIG. 3, of the printed circuit board and jackwire contacts of the communications connector 10 that shows how the jackwire contacts deflect when a mating plug is received within the connector 10. FIG. 6 is a perspective view of the printed circuit board and jackwire contacts of the communications connector 10. FIG. 7 is a plan view of the printed circuit board of FIG. 3. In FIG. 7, the cross-hatching used in drawing the conductive traces indicates which layer of the printed circuit board the conductive trace (or segment thereof) resides on. FIG. 8 is a side view, taken along the line 4-4 of FIG. 3, of the printed circuit board and jackwire contacts of the communications connector 10 with certain dimensions specified that may be used in connectors according to certain embodiments of the present invention.

The communications connector 10 illustrated in FIG. 3 is a modular Registered Jack 45 (RJ-45) jack that is configured to mate with a modular plug. RJ-45 refers to a wiring standard that describes wiring specifications for eight wire connectors that are commonly used to connect computers and other hardware to, for example, local area networks (LAN) and/or the Internet. It will be appreciated, however, that communications connectors according to embodiments of the present invention may comprise other types of connectors such as RJ-45 patch panel jacks, and may have different numbers of wires and/or be configured according to different wiring standards such as, for example, the RJ-11 standard that describes wiring specifications for certain 4 and 6 wire connectors.

As shown in FIG. 3, the communications connector 10 comprises an assembly 20 which is enclosed within an electrically insulative or dielectric jack housing 12, terminal housing 14 and cover 16. Herein the parts 12, 14 and 16 may be collectively referred to as the "connector housing." The jack housing 12 receives a front part of the assembly 20 which is inserted into an opening in the rear of the jack housing 12. The jack housing 12 further includes an opening 13 that is sized and configured to receive a modular plug (not shown in FIG. 3) that is inserted into the jack housing 12 along the axis P. Terminal housing 14 is fitted over and protects an upper surface of the assembly 20. Cover 16 fits beneath the assembly 20 and attaches to the terminal housing 14 to protect a lower surface of the assembly 20. It will be appreciated that typically the connector 10 will be installed in an orientation that is flipped upside down from the orientation shown in FIG. 3 in order to reduce buildup of dust and dirt on the contacts of the connector 10.

The assembly 20 includes a printed circuit board 30. The printed circuit board 30 may comprise, for example, a single or multi-layered dielectric substrate that includes a top surface 32, a bottom surface 34, a forward edge 36 and a rear edge 38. The printed circuit board 30 further includes a plurality of conductive traces or paths 48 (see FIG. 7) that extend between and electrically connect input terminals of the printed circuit board 30 to respective output terminals of the printed circuit board 30. In the particular embodiment pictured in FIGS. 3-8, the input terminals of the printed circuit board 30 comprise contact pads 40 that are located on the top surface 32 of the printed circuit board 30 (see FIG. 7), and the output terminals comprise metal-plated holes 42. The metal-plated holes 42 are located in two rows located along the side edges of the printed circuit board 30. Each row extends from approximately the middle of the printed circuit board 30 to the rear edge 38 of the board 30. The output terminals may be located in patterns different than two rows. It will be understood that the printed circuit board 30 may comprise any conventional printed circuit/wiring board, a flexible printed circuit board, or any other type of substrate that includes conductive paths that connect input terminals to respective output terminals. As discussed in more detail herein, the printed circuit board 30 may also include electrical circuit components or devices arranged on or within the board to compensate for crosstalk that may otherwise be present in the connector and an associated plug. Such devices include, but are not limited to, closely spaced wire traces printed on or within layers of the printed circuit board 30 (including, for example, side-by-side conductive trace segments and overlying conductive trace segments), plate capacitors implemented on two or more layers or surfaces of the board, interdigitated finger capacitors such as the interdigitated finger capacitors disclosed, for example, in U.S. Pat. No. 5,997,358, and discrete electrical components such as inductors, capacitors or resistors that are mounted on or within the printed circuit board 30.

Turning again to FIG. 3, in addition to the printed circuit board 30, the assembly 20 further includes a number (in this particular embodiment, eight) of spring jackwire contacts 50 that wrap around the forward edge 36 of the printed circuit board 30. Herein, the term "contact", when used as a noun, refers to an electrically conductive element that is designed to establish physical and electrical contact with an external electrically conductive element. The jackwire contacts 50 depicted in FIG. 3 are one such type of contact that is known in the art. The contacts 50 are referred to as "jackwire" contacts because the contacts are configured to resiliently deflect from a resting position when contacted by a mating plug, and then spring back to the resting position when the plug is removed. As shown in FIG. 3, the jackwire contacts 50 extend above the printed circuit board 30 at an acute angle relative to the top surface 32 of the printed circuit board 30.

The assembly 20 also includes a plurality of wire connection terminals 70 that are mounted in the output terminals of the printed circuit board (in the embodiment of FIG. 3, the output terminals comprise the metal-plated holes 42 that receive the wire connection terminals 70). The wire connection terminals 70 may be implemented as insulation displacement terminals (IDCs). The IDCs 70 may include a base having a "needle-eye" construction that allows the base to be pushed into one of the metal-plated holes 42. The metal-plated holes 42 may have a diameter that is slightly less than the diameter of the needle-eye, which may facilitate providing a reliable electrical connection between each IDC 70 and its respective metal-plated hole 42 without a need for soldering. The IDCs or other wire connection terminals 70 may alternatively be soldered in place or press-fit in place by other means. It will also be appreciated that the wire connection terminals 70 may be replaced with other innovative connection pattern schemes.

The terminal housing 14 mounts over the wire connection terminals 70 to protect the IDC terminals 70 and the top surface 32 of the printed circuit board 30. The terminal housing 14 also permits wire lead access to the IDC terminals 70. The terminal housing 14 includes a pair of mounting posts 18 that project from a bottom surface of the terminal housing 14. When the terminal housing 14 is aligned with the IDC terminals 70 on the printed circuit board 30 and lowered to surround the IDC terminals 70, the mounting posts 18 align with a pair of mounting holes 49 provided in the printed circuit board 30 and pass through them to project from the bottom surface 34 of the printed circuit board 30.

The cover 16 may protect the bottom surface 34 of at least part of the printed circuit board 30. The cover 16 includes a pair of openings (not shown in FIG. 3) that are formed along a center line between sides of the cover 16 that align with tips of the terminal housing mounting posts 18. The printed circuit board 30 is "sandwiched" or captured between the terminal housing 14 and the cover 16, and the tips of the mounting posts 18 may be joined to the body of the cover 16 by, for example, an ultrasonic welding probe inserted into the cover openings from below the cover 16. The tips of the mounting posts 18 and the surrounding body of the cover 16 melt and fuse with one another to form solid joints when cooled. With the printed circuit board 30 thus captured between the terminal housing 14 and the cover 16, most or all of the rear portion of the printed circuit board 30 may be protectively enclosed.

As also shown in FIG. 3, the jack housing 12 has a latch 15 protruding below its rear opening. The bottom forward edge of the cover 16 includes a raised protrusion that mates with the latch 15. The terminal housing 14 likewise has a pair of side catches 22 protruding from the forward part of both sides of the housing 14. The side catches 22 may comprise, for example, snap clips that have hooked projecting ends that are configured to snap into and lock within respective recesses 24 provided in the side walls of the jack housing 12. Once the terminal housing 14 is joined to the cover 16 with the circuit board 30 captured between them, the forward edge 36 of the printed circuit board 30 is inserted into the rear opening in the jack housing 12 until the side catches 22 snap into place in their respective recesses 24 in the jack housing 12 and until the latch 15 snaps over and onto the raised protrusion on the bottom of cover 16 to securely join the jack housing 12 to the remainder of the connector 110.

The jack housing 12, the terminal housing 14 and the cover 16 may be formed, for example, of a plastics material that meets applicable standards with respect to electrical insulation and flammability, such as Polyvinyl Chloride (PVC), Acrylonitrile Butadiene Styrene (ABS), or polycarbonate. It will be appreciated that many other electrically insulative or dielectric materials may be used.

While the jack housing 12, the terminal housing 14 and the cover 16 provide one example of a housing structure that may enclose the assembly 20, it will be appreciated that a wide variety of different housing structures could be used, and/or that the assembly 20 could be constructed as part of the housing itself as opposed to a separate piece. Thus, embodiments of the present invention need not be limited to any particular housing structure, and the above-provided detailed description of one particular housing arrangement is provided so that the present disclosure will be thorough and complete.

As shown best in FIG. 4, in the particular embodiments of FIGS. 3-8, each jackwire contact 50 (the two jackwire contacts that are visible in FIG. 4 are labeled 50a and 50b, respectively) may include a mounted end 52, a lower section 53, a vertical section 54, a pad contact region 56, a plug contact region 58 and a free end portion 59. The lower section 53, vertical section 54, pad contact region 56, and plug contact region 58 together comprise an intermediate segment of the contact 50 that connects the mounted end 52 to the free end portion 59. The jackwire contacts 50 may be formed, for example, of a copper alloy such as spring-tempered phosphor bronze, beryllium copper, or the like. A typical cross-section of each jackwire contact 50 is 0.015 inch wide by 0.010 inch thick, although other sized and/or shaped (e.g., round) contacts may be used.

The mounted end 52 of each jackwire contact 50 is mounted in a respective one of a plurality of metal-plated openings 46 that are provided on the bottom surface 34 of the printed circuit board 30 (while the metal-plated openings 46 may extend all the way tip to the top surface 32 of the printed circuit board 30, a contact is considered to be "mounted in" the surface of the printed circuit board from which the remainder of the contact protrudes). The "mounted end" 52 of a contact 50 refers to an end portion of the contact that is securely mounted (i.e., held in a fixed position) in some structure such as, for example, a printed circuit board or a portion of the jack housing. The mounted ends 52 of the jackwire contacts 50 may have a "needle eye" construction that allows the ends to be pushed into the metal-plated holes 46. The metal-plated holes 42 may have a diameter that is slightly less than the diameter of the mounted ends 52 of the jackwire contacts 50, which may facilitate providing a reliable electrical connection between each jackwire contact 50 and its respective metal-plated hole 46 without a need for soldering.

The lower section 53 of each jackwire contact 50 may run generally parallel to and beneath the bottom surface 34 of the printed circuit board 30. The vertical section 54 of each contact 50 may run adjacent to the forward edge 36 of the printed circuit board 30. As shown best in FIGS. 4-5, in the embodiment of FIGS. 3-8, a mandrel 41 may be provided between the jackwire contacts 50 and the bottom surface and/or the forward edge 36 of the printed circuit board 30. The mandrel 41 may be provided to facilitate keeping the contacts 50 in proper alignment. As shown best in FIG. 6, the mandrel 41 may include a plurality of recesses 43 that define a comb structure that acts to properly align the jackwire contacts 50. Jackwire contacts 50 are positioned in respective ones of the recesses 43. The vertical sections 54 of the jackwire contacts 50 may be "free-floating" in that they do not contact the mandrel 41 when a plug is not inserted in the jack housing 12. When a plug is inserted, this allows the jackwire contacts 50 to deflect around the curved portion between the lower section 53 and tip to the plug blade contact point A absorbing the strain energy over a longer length of the contact 50. In other embodiments, the vertical sections 54 of the jackwire contacts 50 may be "partially free-floating" in that the upper portions of the vertical sections 54 do not contact the mandrel 41 except when a plug is not inserted in the jack housing 12, while lower portions of the vertical sections 54 contact the mandrel 41 even when a plug is not inserted in the jack housing 12. In still other embodiments, the jackwire contacts 50 may be arranged so that they contact the mandrel 41 along the entire length of the recesses 43 even when a plug is not inserted in the jack housing 12.

The plug contact region 58 refers to the portion of a jackwire contact 50 that is configured to make mechanical and/or electrical contact with the contacts (e.g., blades) of a modular plug that is inserted into the communications connector 10. In the embodiment of FIGS. 3-8, the plug contact region 58 of each jackwire contact 50 is the upper portion of the angled segment that extends from the top of the vertical section 54 to the forward side of the undulation region 51 (which is described below). The pad contact region 56, as discussed below, is the portion of a jackwire contact 50 that makes physical and electrical contact with a corresponding contact pad 40 (see FIGS. 4-6) that is provided on the printed wire board 30.

As shown best in FIGS. 4-5, each jackwire contact 50 may include an undulation region 51 such as the U-shaped bend depicted in the figures. Herein, references to an "undulation" in a jackwire contact refer to a portion of the contact that dips closer to a printed circuit board to make electrical contact 50 with a contact pad when a plug is inserted into the connector. The undulation may, for example, be U-shaped or V-shaped or some other shape, and it may be shallow or deep. The undulation also need not be symmetric. As discussed in more detail herein, the undulation region 51 in each jackwire contact 50 is positioned over a corresponding contact pad 40. When a modular plug is brought into contact with the jackwire contacts 50 (i.e., when the modular plug is inserted into a communications connector that includes the assembly 20), the jackwire contacts 50 are forced downward to mate with their respective contact pads 40, and a lower portion of the undulation region 51 of each contact 50 makes mechanical and electrical connection with its corresponding contact pad 40. Typically, a wiping action will result where the undulation region 51 of the jackwire contact 50 wipes across the contact pad 40 to provide a robust electrical connection.

As shown best in FIGS. 4-6, the mounted ends 52, lower sections 53, vertical sections 54 and plug contact regions 58 of the jackwire contacts 50 may, in some (but not all) embodiments of the present invention, be arranged in a parallel side-by-side relationship. In particular, with respect to these regions of the jackwire contacts 50, the contacts 50 are arranged in a row, and each jackwire contact 50 maintains a substantially constant distance from its one or two neighboring jackwire contacts 50 over substantially the entire length of these regions 53, 54, 58 of the contacts 50. Accordingly, as shown in FIG. 4, when the assembly 20 is viewed from a side cross-sectional view, regions 53, 54 and 58 are visible for only a single one of the eight jackwire contacts 50, as these regions of the remaining jackwire contacts are aligned behind the pictured contact and hence are hidden from view. In contrast, the pad contact regions 56 and free ends 59 of the jackwire contacts 50 may be "staggered" relative to at least their adjacent jackwire contacts 50. This can best be seen in FIG. 4 which depicts two adjacent jackwire contacts 50a, 50b that have staggered pad contact regions 56 and free ends 59. In particular, the pad contact region 56 of jackwire contact 50a is to the left of the pad contact region 56 of jackwire contact 50b. Likewise, the free ends 59 of jackwire contacts 50a and 50b are staggered with respect to each other. Herein, references to "staggered" contacts refer to contacts (or portions thereof) that are not aligned when the contacts are viewed from a side cross-sectional view. Examples of communications connectors having staggered contacts may be found in U.S. Pat. No. 6,086,428 and U.S. Pat. No. 5,911,602.

FIG. 8 is identical to FIG. 4 except that it includes various dimensions associated with one specific embodiment of the communications connector 10. As shown in FIG. 8, in certain embodiments of the present invention, the bottom surface of the plug blades may enter the connector 10 at a height of about 0.05" to 0.07" above the top surface 32 of the printed circuit board 30. A typical plug blade, when inserted in the jack housing 12, will overlie approximately the first 0.1" to 0.2" of the front surface 34 of the printed circuit board 30. When the plug is inserted, it may "over travel" further into the jack housing 12 by about 0.02" before falling back into its final (latched) resting position. As discussed above, immediately adjacent and to the right of the plug contact area 58, contact 50a includes a generally U-shaped undulation region 51 that includes the pad contact region 56 at the bottom of the "U." The downward bend that forms the lefthand side of this U-shaped undulation region 51 starts approximately 0.1" to 0.2" from the front edge 36 of the printed circuit board 30, and the bend that defines the end of the righthand side of this U-shaped undulation region 51 is located approximately 0.2" to 0.4" from the front edge 36 of the printed circuit board 30. In this particular embodiment, the free end 59 of each contact 50 is positioned at an angle of approximately 15 to 45 degrees with respect to the top surface 32 of the printed circuit board 30.

In operation, a modular plug (not shown in FIGS. 3 and 6-7; a single blade of the modular plug is depicted in FIGS. 4-5 and 8) is inserted along the axis P (see FIG. 3) into the opening 13 included in the front face of jack housing 12. As shown best in FIG. 5, when the modular plug is inserted into the opening 13, blades or other contacts of the plug contact respective ones of the jackwire contacts 50. The jackwire contacts 50 may comprise spring jackwires that are resiliently deflected by the plug blades toward the top surface 32 of the printed circuit board 30. The spring force of the deflected jackwire contacts 50 holds the jackwire contacts 50 in firm contact against respective ones of the plug blades, thereby establishing an electrical connection between each of the plug blades and a respective one of the jackwire contacts 50.

As discussed above, pursuant to embodiments of the present invention, the input terminals of the connector 10 may comprise a plurality of contact pads 40 that are provided on the top surface 32 of the printed circuit board 30 (and/or within the printed circuit board 30). Each of the contact pads 40 is arranged so as to mate with the pad contact region 56 of a respective one of the jackwire contacts 50 when a modular plug is inserted into the connector 10, thereby deflecting the jackwire contacts 50. The contact pads 40 may be implemented as any conductive pad or other structure that makes reliable electrical contact with its respective jackwire contact under appropriate conditions (e.g., when a plug is inserted into the jack). The contact pads 40 may comprise generally two-dimensional plated metal pads or may comprise three-dimensional structures such as, for example, conductive nails, blocks, columns or the like that extend above the top surface 32 of the printed circuit board 30.

FIGS. 6-7 more clearly illustrate one implementation of the contact pads 40 according to embodiments of the present invention. As best shown in FIG. 7, a plurality of contact pads 40 are arranged in a pattern in the forward-central region of the printed circuit board 30. In the embodiment of FIGS. 3-8, a total of eight contact pads 40 are provided. Each contact pad 40 is positioned to mate with a respective one of the jackwire contacts 50 when, as discussed above, a modular plug is inserted into the opening 13 in the jack housing 12. When the jackwire contacts 50 mate with respective ones of the contact pads 40, an electrical connection is established such that an electrical signal may pass from the jackwire contact 50 to the contact pad 40 (or vice versa). The contact pads 40 may be formed of a variety of conductive materials such as, for example, copper or copper alloys (with or without plating). In certain embodiments of the present invention, the contact pads 40 may comprise a gold or nickel plated copper alloy. The contact pads 40 comprise generally rectangular pads that are deposited on the top surface 32 of the printed circuit board 30. While an insulative layer is typically deposited on top of the conductive traces 48 that are provided on the top surface 32 or bottom surface 34 of a printed circuit board 30 in order to, among other things, protect such traces 48 and/or to prevent inadvertent short circuits, it will be appreciated that such an insulative layer, if provided, is not present at the location of each contact pad 40. This allows each contact pad 40 to make electrical and mechanical connection with a respective one of the jackwire contacts 50 when a modular plug is inserted in the communications connector 10.

As is also shown in FIG. 6, the outside two contact pads 40 are deposited directly next to respective recesses 47 that are formed in the top surface 32 of the printed circuit board 30. The recesses 47 are provided so that if an RJ-11 style plug is inserted into the connector 10, the outside jackwire will be forced into its respective one of the recesses 47. This may reduce the likelihood that either or both of the outside jackwire contacts 50 experience excessive and/or permanent deformation if an RJ-11 style plug is inserted into the jack housing 12, as might otherwise occur when an RJ-11 plug is inserted into a connector 10 that is primarily configured to receive RJ-45 plugs. Further explanation of how the recesses 47 reduce or prevent deformation of the jackwire contacts 50 is provided in commonly assigned U.S. Pat. No. 6,767,257, the entire contents of which (except for any definitions) are incorporated herein by reference as if set forth fully herein.

In the embodiment of FIGS. 3-8, the contact pads 40 are located in a forward-central area of the printed circuit board 30. It will be appreciated, however, that the contact pads 40 may be located at a wide variety of different places on or within the printed circuit board 30.

As best shown in FIG. 4, in the communications connector 10 of FIGS. 3-8, the jackwire contacts 50 are normally not in contact with their respective contact pads 40. However, as shown in FIG. 5, when a modular plug is inserted into the communications connector 10, each jackwire contact 50 is forced downward towards the top surface 32 of printed circuit board 30 where it makes both mechanical and electrical connection with its respective contact pad 40. As is also shown in FIG. 5, in certain embodiments of the present invention, the distance from the plug blade/jackwire contact point (point "A" in FIG. 5) to the point where adjacent jackwire contacts 50 "separate" (i.e., the point where no part of two adjacent jackwire contacts 50 are overlapped when viewed from a side cross-sectional view such as the view of FIG. 5) may be made very small. For example, as shown in FIG. 5, in one particular embodiment, the distance from the plug blade/jackwire contact point to the point where adjacent jackwire contacts 50 separate is approximately 0.063 inches. As discussed in more detail herein, in certain embodiments of the present invention, improved crosstalk performance may be provided by keeping this distance relatively small.

As shown best in FIG. 7, a plurality of conductive paths 48a-48h are provided on the printed circuit board 30 that extend between the contact pads 40 of the printed circuit board 30 and the metal-plated holes 42. As shown in FIG. 7, a conductive path may simply comprise a copper trace that resides on a single layer of the printed circuit board 30, or alternatively may comprise, for example, a series of conductive vias and copper trace segments that reside on multiple layers of the printed circuit board 30 that together electrically connect one of the contact pads 40 to one of the metal-plated holes 42. In FIG. 7, the cross-hatching on the conductive traces 48a-48h (or segments thereof) indicates the specific layer of the printed circuit board 30 on which each conductive trace or segment thereof resides in the particular embodiment of FIGS. 3-8. It will be appreciated that a wide variety of different conductive path routing schemes may be used. These conducting path routing schemes may, or may not, be designed to provide crosstalk compensation on the printed circuit board 30.

As noted above, in the embodiment of FIGS. 3-8, the contact pads 40 comprise the input terminals through which communications signals are coupled onto the printed circuit board 30, and the metal-plated holes 42 that receive the IDCs 70 comprise the output terminals. Herein, "input terminals" and "output terminals" refer to, respectively, the structure through which electrical signals are transferred into or out of something (e.g., a printed circuit board, a communications connector, etc.). It will be understood that whether or not a particular structure comprises an "input" terminal or an "output" terminal will depend upon the direction of travel of the electrical signal. To simplify the description, a like set of terminals (e.g., the contact pads 40 or the metal-plated holes 42) are referred to collectively as either a set of "input" terminals or a set of "output" terminals, even though in operation some of the electrical signals may travel in different directions.

The communications connector 10 of FIGS. 3-8 includes eight signal carrying paths. Herein, the term "signal carrying path" refers to a direct path that may be used to carry a signal coupled onto an input terminal of the connector to an output terminal of the connector. Each signal carrying path, thus, carries a signal that is input from a plug contact onto one of the jackwire contacts 50 of the connector 10 to a corresponding IDC 70 of the connector 10 (or vice versa). Thus, by way of example, each signal carrying path in the connector 10 extends from the plug contact region 58 of one of the jackwire contacts 50, along the jackwire contact 50 to the pad contact region 56, through the corresponding contact pad 40, along the one of the conductive traces 48a-48h that is connected to the contact pad 40, through one of the metal-plated IDC holes 42 to which the other end of the conductive trace 48a-48h connects, and finally through one of the IDCs 70. It will be appreciated that, in many cases, branch segments will extend from one or more of the signal carrying paths within a communications connector. These branch segments may be electrically connected to the signal carrying path, but are not part of the signal carrying path, as the branch segments may "dead-end" in which case the input signal generally does not traverse the branch segment when traveling from the input terminal to the output terminal of the connector. For example, in the connector 10 of FIGS. 3-8, the free end 59 of each contact and the vertical and lower segments 53, 54 of each contact comprise branch segments that extend from a respective one of the signal carrying paths. These branch segments are electrically connected to the signal carrying path, but are not part of the signal carrying path, as they "dead-end" instead of providing a direct conductive path from the input of the connector 10 to the output of the connector 10. Various other branches that are not part of the signal carrying path may also be provided such as, for example, interdigitated finger and/or plate capacitors (discussed below) that may be connected to the metal-plated hole 46 that receives the termination end 52 of the jackwire contact and/or which branch off of the contact pads 40, the conductive paths 48a-48h and/or the metal-plated holes 42 that receive the IDCs 70. It will also be appreciated that more than one signal carrying path may exist between a specific input terminal and its respective output terminal. In such cases, both paths together constitute the signal carrying path.

The printed circuit board 30 in communications connector 10 may comprise a multi-layer printed circuit board 30. In the specific embodiment illustrated in FIG. 7, the printed circuit board comprises a six layer printed circuit board. As noted above, different cross-hatching is used to illustrate on which layer of the printed circuit board 30 each conductive trace/conductive trace segment resides. As shown in FIG. 7, the conductive traces are arranged to provide a conductive path between each input terminal (conductive pad 40) and each output terminal (metal-plated hole 42) of the printed circuit board 30.

The conductive paths 48a-48h may be dimensioned and arranged on one or more layers of the printed circuit board 30 in such a manner that crosstalk is substantially reduced over an entire connection comprising the electrical connector 10 and an associated plug. U.S. Pat. No. 5,997,358, incorporated by reference herein, depicts a connector having a printed circuit board with eight layers that implements a multi-stage compensation scheme for substantially eliminating crosstalk that is present, for example, at the input terminals of the printed circuit board. Such crosstalk compensation schemes may be implemented in numerous different forms, and may rely on, for example, inductive and/or capacitive coupling between the conductive paths 48a-48h and/or discrete components such as capacitors and inductors for crosstalk reduction between pairs of conductive paths. Embodiments of the present invention are not limited to any particular configuration or strategy for reducing and/or eliminating crosstalk on the printed circuit boards of the connectors disclosed herein, and it will also be appreciated that at least some of the crosstalk compensation may be achieved in other locations such as in the jackwire contacts, in the plug, in a second printed circuit board, etc.

In the particular embodiment of FIGS. 3-8, a number of crosstalk compensation elements are provided on the printed circuit board 30. For example, as shown in FIG. 7, a number of interdigitated finger capacitors 49 are provided on various layers of the printed circuit board 30 that provide capacitive compensatory crosstalk between various of the conductive paths. Several of these interdigitated finger capacitors are coupled to two of the metal-plated holes 46 that receive respective of the mounted ends 52 of the jackwire contacts 50. As these mounted ends 52 of the jackwire contacts 50 are not part of the signal carrying path, but instead comprise branches off of the signal carrying paths, the interdigitated finger capacitors 49 coupled to them may effectively provide capacitive crosstalk compensation at the point of contact between the plug blades and the jackwire contacts 50.

Segments of various conductive traces are also routed directly adjacent to each other (see, e.g., the parallel segments designated by reference numeral 45) in order to provide inductive or both inductive and capacitive coupling between selected of the conductive paths. In some embodiments of the present invention, the conductive paths of conductors 3 and 6 of pair 3 may include a crossover 43 on the printed circuit board 30 (see FIG. 7 where conductor 3 crosses over conductor 6). This crossover 43 facilitates routing a segment of conductor 3 adjacent to conductor 5 in order to provide inductive and capacitive coupling between conductors 3 and 5 on the printed circuit board 30 (the leftmost contact pad 40 on printed circuit board 30 is part of conductor 1, while the rightmost contact pad 40 is part of conductor 8, with the contact pads for conductors 2-7 spaced in order therebetween), and allows routing a segment of conductor 6 adjacent to conductor 4 in order to provide inductive and capacitive coupling between conductors 6 and 4 on the printed circuit board 30. It will also be appreciated that the equivalent of a crossover 43 may be accomplished on the printed circuit board 30 in other ways.

In some embodiments of the present invention, such as the embodiments depicted in FIGS. 3-8, the crossover 43 of the conductors of pair 3 (or other equivalent structure) may be implemented close to the point where the signals carried by conductors 3 and 6 are coupled onto the printed circuit board 30. In this manner, the compensatory crosstalk compensation provided by the crossover 43 (and in particular, provided by the adjacent segments of conductors 3/5 and the adjacent segments of conductors 4/6) may be injected at relatively small delays from the offending crosstalk that is introduced in the plug-jack contact area of the mated plug and jack connector.

The jackwire contacts 50 according to certain embodiments of the present invention may be relatively simple to manufacture and install within the connector 10. For example, each of the jackwire contacts 50 of communications connector 10 reside in a single plane. As such, each jackwire contact may be fabricated by bending a wire or strip of metal in a single plane. Such jackwire contacts 50 may be simpler and less expensive to manufacture than the jackwires contacts included in many conventional communications connectors that include, for example, crossing contacts which require that the contacts be bent in multiple planes. In addition, the jackwire contacts 50 of certain embodiments of the present invention that do not include crossing contacts may be easier to install during assembly of the connector 10.

Figure 2:
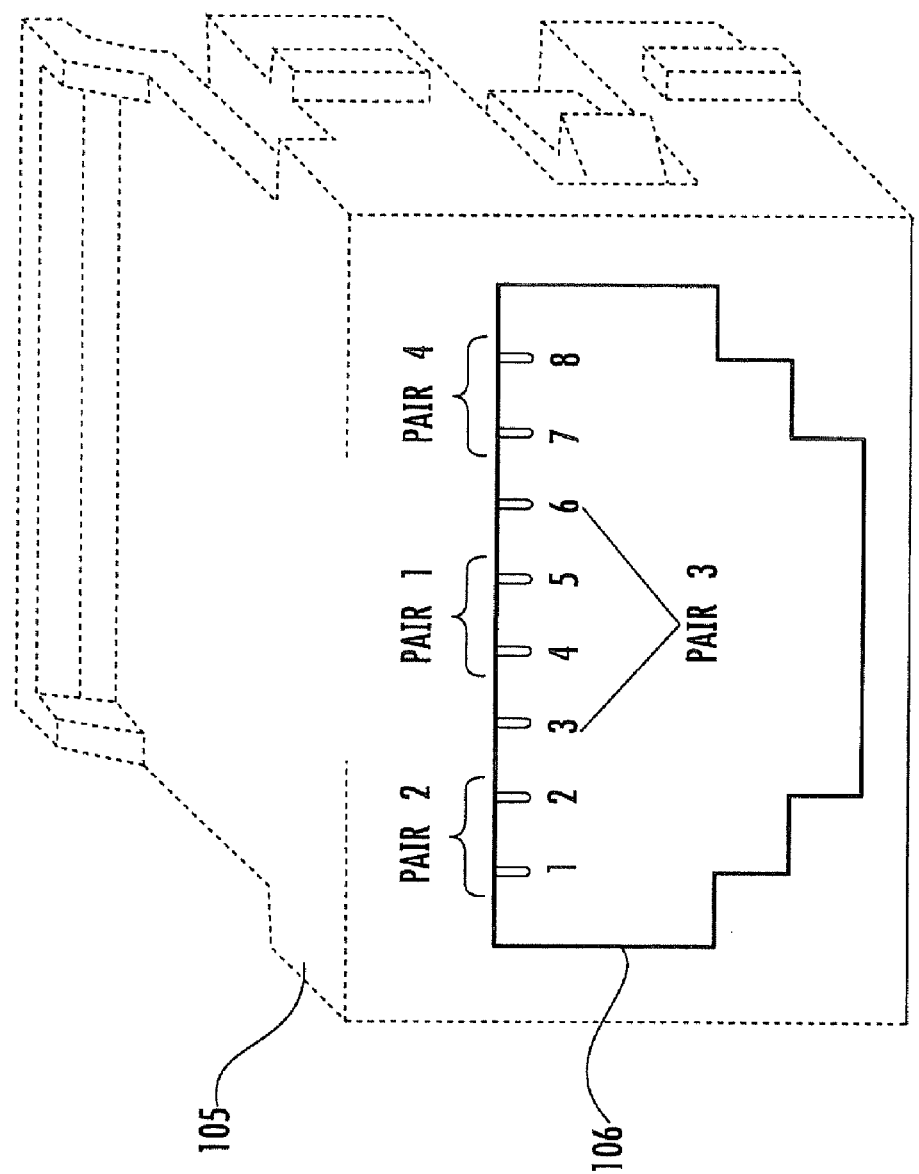
FIG. 2 shows the modular jack contact wiring assignments for an 8-position telecommunications outlet (T568B) as viewed from the front opening of a jack.

The above-discussed stagger that is provided between adjacent of the jackwire contacts 50 may facilitate reducing the amount of crosstalk (differential-to-differential and/or differential-to-common mode) that may be introduced in the jackwire contact region 50 of the communications connector 10. In particular, as discussed above with respect to FIG. 2, crosstalk may occur in the jackwire contact region of a mated plug-jack communication connector due to the industry standardized configuration of the plug and jack contacts. This crosstalk is typically most severe with respect to pair 1 (conductors 4 and 5) and pair 3 (conductors 3 and 6), and hence the following description focuses on these pairs. As shown best in FIG. 5, in the connector 10 of FIGS. 3-8, while the jackwire contacts for conductors 3 and 4 (and for conductors 5 and 6) are routed parallel to each other from their termination ends 52 to the plug-jack contact point (i.e., in the portion of each jackwire contact 50 that is not part of a signal carrying path), the paths of the jackwire contacts for conductors 3 and 4 (and for conductors 5 and 6) diverge so that they are not routed parallel to each other from the plug-jack contact point to the free ends 59 of each contact 50. As such, very little offending inductive crosstalk is generated between conductors 3 and 4 in the jackwire contact 50 region of the connector 10 and, in fact, some level of compensatory inductive crosstalk may be introduced (since, for example, the path of conductor 3 diverges from the path of conductor 4 rearwardly of the plug-jack contact region while the paths of conductors 3 and 5 are routed parallel to each other rearwardly of the plug-jack contact region). By limiting the amount of offending inductive crosstalk, and by compensating for such inductive crosstalk at a small delay from the location where the offending inductive crosstalk is introduced, it may be possible to drive both NEXT and FEXT crosstalk to low levels over a broad frequency range.

An additional feature of the connectors according to embodiments of the present invention is that they may locate the contact pads 40 at a relatively short electrical distance from the plug contact area 58 of the jackwire contacts 50, thereby reducing or minimizing the delay between the plug-jack contact region and the printed circuit board 30. This is because the electrical distance between the plug contact area 58 of a jackwire and the printed circuit board 30 is the distance between the plug contact area 58 and the pad contact area 56 which, as shown in the figures, may be relatively short. The jackwire contacts 50 are significantly longer than the distance between the plug contact area 58 and the pad contact area 56 for, among other things, a variety of reasons relating to the mechanical operation of the connector 10. By having the mounted end 52 of each jackwire contact 50 as a branch off of the signal carrying path, relatively long contacts 50 that have excellent mechanical performance may be provided while providing jackwire contacts 50 that have a relatively short electrical distance between the plug-jack contact area and the printed circuit board 30. As a result, the additional crosstalk generated in the jackwire contact region may be relatively small, and may be relatively easy to compensate for on, for example, the printed circuit board 30.

Figure 9:
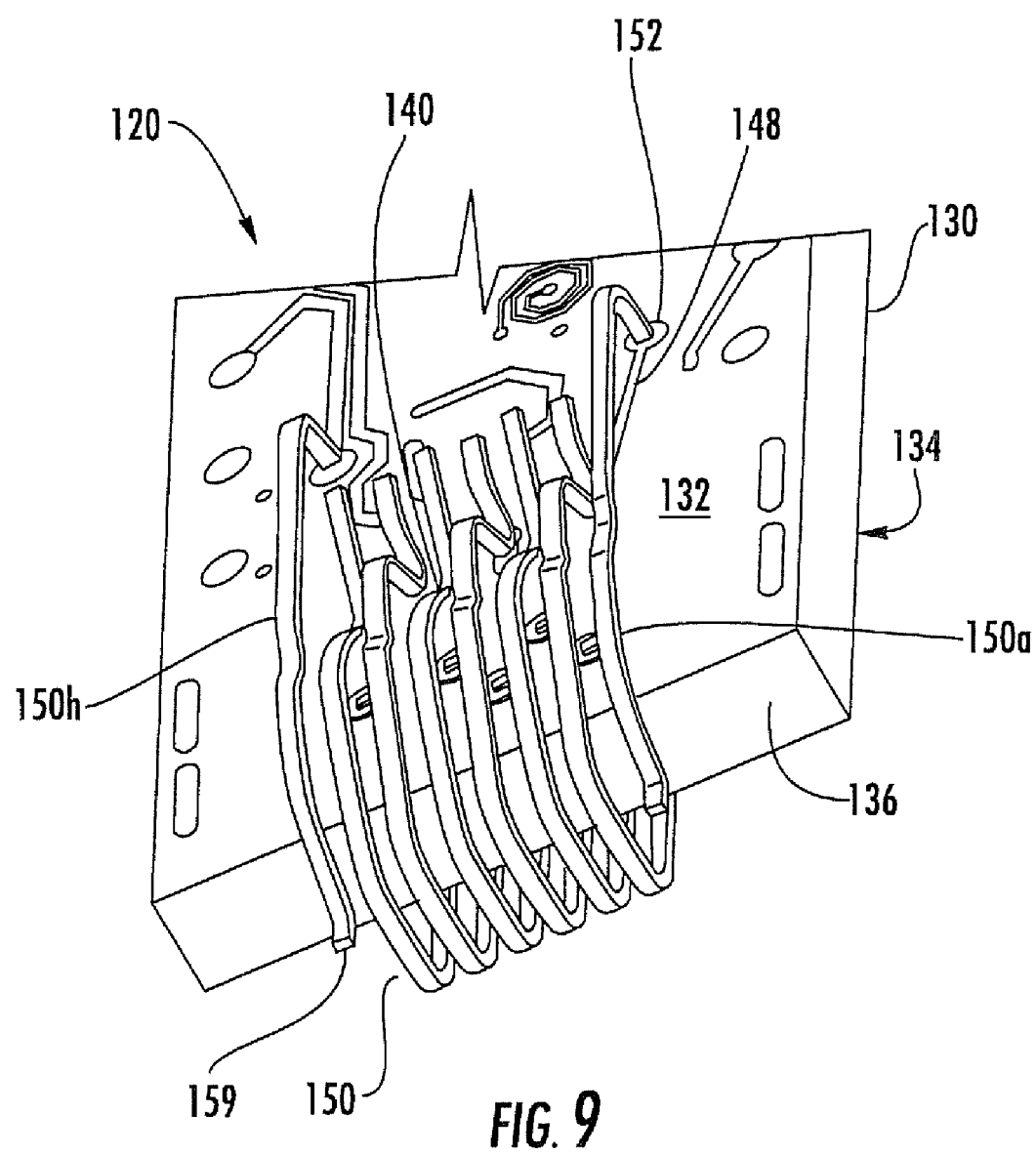
FIG. 9 is a perspective view depicting the jackwire contact configuration of a communications connector according to further embodiments of the present invention.
Figure 10:
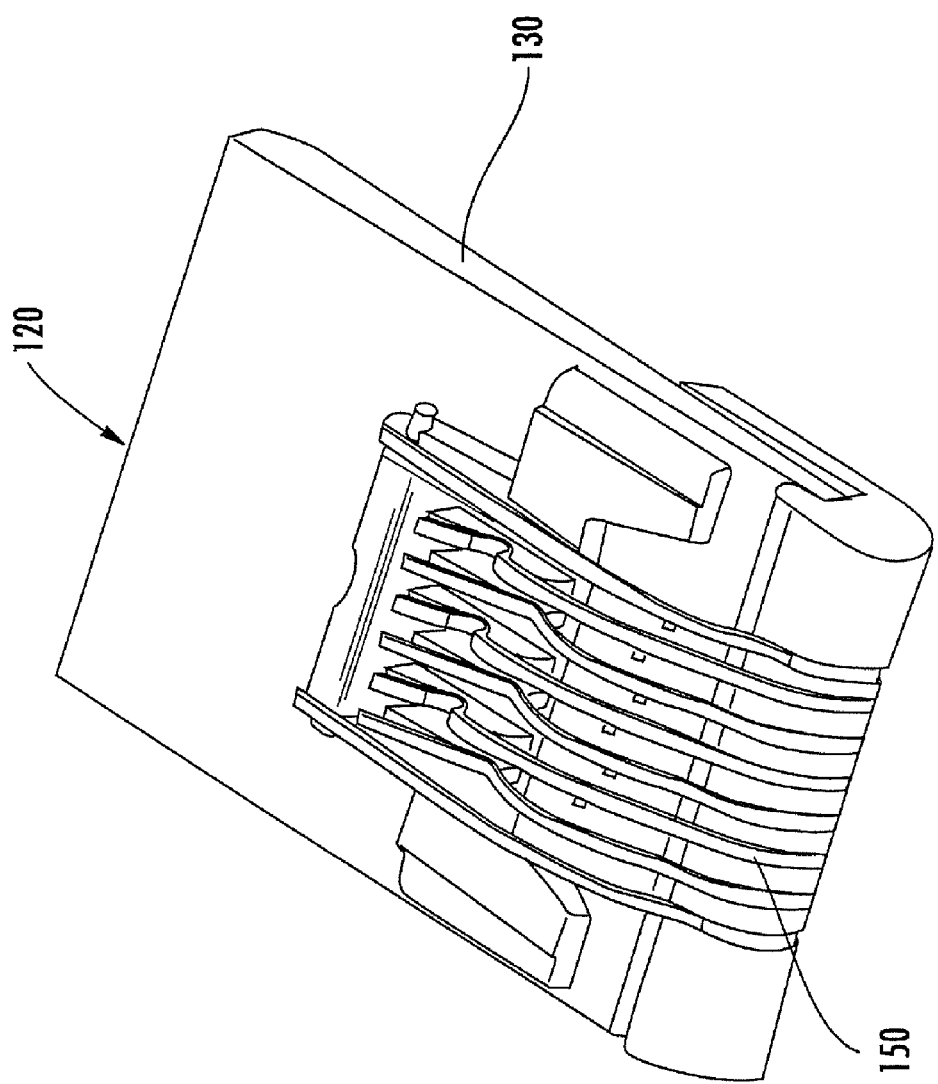
FIG. 10 is a perspective view of the printed circuit board and jackwire contacts of the communications connector of FIG. 9.

FIG. 9 is a perspective view of a portion of an assembly 120 (with the IDC terminals omitted) for a communications connector according to further embodiments of the present invention. The assembly 120 may be used in conjunction with, for example, the same housing structures 12, 14, 16 included with the connector 10 of FIGS. 3-8. FIG. 10 is a perspective view of the assembly 120 of FIG. 9 (with the IDC terminals omitted).

As shown in FIG. 9, the assembly 120 includes a printed circuit board 130 six jackwire contacts 150 that each have a mounted end that is mounted in the bottom surface 134 of the printed circuit board 130. The printed circuit board 130 includes a plurality of conductive paths 148 (only a few of which are shown in FIG. 9), and a plurality of contact pads 140 are mounted on the top surface 132 of the printed circuit board 130. In addition to the six jackwire contacts 150 having mounted ends that are mounted in the bottom surface 134 of the printed circuit board 130, the assembly 120 further includes two jackwire contacts 150a, 150h (the outside two contacts) that have mounted ends that are mounted in the top surface 132 of the printed circuit board 130. Thus, the jackwire contacts 150 in the assembly 120 are cantilevered from the front toward the rear of the printed circuit board 130, while the jackwire contacts 150a, 150h are cantilevered from the rear toward the front of the printed circuit board 130. In each of the jackwire contacts 150a, 150h, an information signal coupled onto the contact from a plug blade travels onto the printed circuit board 130 through a signal carrying path that goes through mounted end 152 of the contact.

The assembly 120 of FIG. 9 may further guard against permanent deformation of the jackwire contacts 150a, 150h in the event that an RJ-11 style plug is inserted into an RJ-45 connector that includes the assembly 120. In particular, the jackwire contacts 150a, 150h have a long mechanical length that may help resist such permanent deformation. In addition, the free end 159 of each of jackwire contacts 150a, 150h extends beyond the forward edge 136 of the printed circuit board 130. As a result, if an RJ-11 style plug is inserted to make contact with the assembly 120, the free ends 159 of jackwire contacts 150a, 150h may be allowed to deflect below the top surface of the printed circuit board 130, which further helps the contacts 150a, 150h resist permanent deformation.

Figure 11:
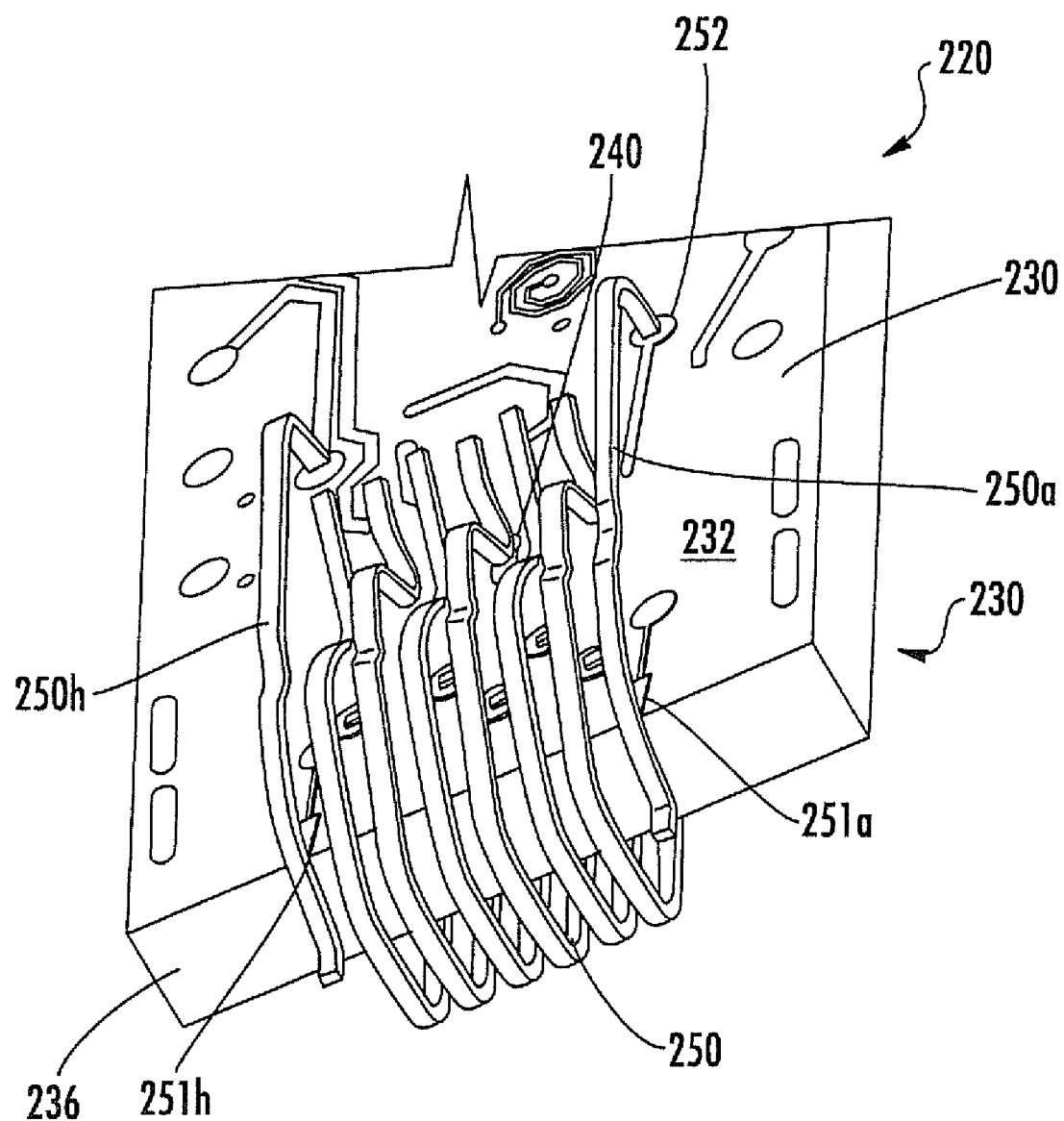
FIG. 11 is a perspective view depicting the jackwire contact configuration of an assembly of a communications connector according to still further embodiments of the present invention.

FIG. 11 is a perspective view of a portion of an assembly 220 for a connector according to still further embodiments of the present invention. The assembly 220 may also be used in conjunction with, for example, the same housing structures 12, 14, 16 included with the connector 10 of FIGS. 3-8.

As shown in FIG. 11, the assembly 220 includes a printed circuit board 230, six jackwire contacts 250 having mounted ends 252 that are mounted in the bottom surface 234 of the printed circuit board 230, and two jackwire contacts 250a, 250h (the outside two contacts) that have mounted ends 252 that are mounted in the top surface 232 of the printed circuit board 230. The printed circuit board 230 includes a plurality of conductive paths 248 (only a few of which are shown in FIG. 11), and a plurality of contact pads 240 are mounted on the top surface 232 of the printed circuit board 230. As shown, the jackwire contact configuration may be identical in assemblies 120, 220 of FIGS. 10 and 11.

In addition, in the embodiment of FIG. 11, deflectable contacts 251a, 251h may be provided at the front edge 236 of printed circuit board 230. The contacts 251a, 251h may protrude from the front edge 236 of the printed circuit board 230, as shown in FIG. 11. The free end region of each of jackwire contacts 250a and 250h may be designed to come into physical contact with deflectable contacts 251a, 251h, respectively, when a mating plug is inserted into a connector that includes assembly 220. Crosstalk compensation elements such as, for example, interdigitated finger or plate capacitors may be included on or within the printed circuit board 220 that are electrically connected through conductive traces and/or metal plated holes to the deflectable contacts 251a, 251h. For example, the deflectable contact 251a may comprise a dead-end branch off of the signal carrying path associated with the jackwire contact 250a (since the signal carrying path goes through the termination end of jackwire contact 250a), and this dead end branch may further include at least one segment that is configured to capacitively couple with portions of a dead end branch off of a signal carrying path associated with another of the plurality of jackwires. As these crosstalk compensation elements would be part of a dead end branch of the signal carrying path for the two outside contacts, the crosstalk compensation elements could be introduced with essentially no delay, which may provide for improved crosstalk compensation. It will also be appreciated that in further embodiments of the present invention the deflectable contacts 251a, 251h could be part of the signal carrying paths for the outside two contacts and the termination ends of contacts 250a, 250h could be dead end branches off of those respective signal carrying paths.

Figure 12:
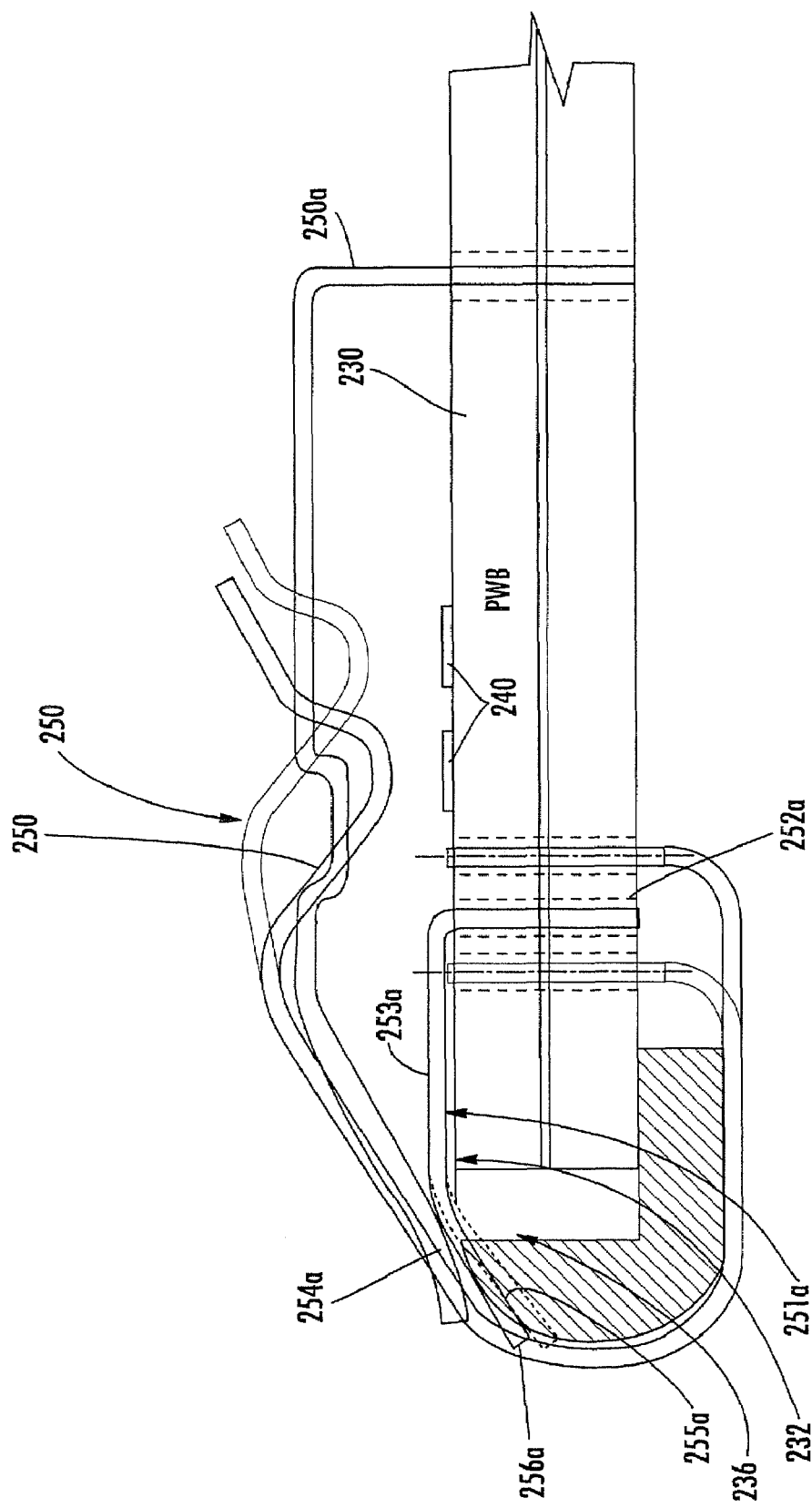
FIG. 12 is a side view of portions of the communications connector of FIG. 11.

FIG. 12 is a side view of the assembly 220 of FIG. 11 that better illustrates one particular implementation of the deflectable contacts according to embodiments of the present invention. In particular, as shown in FIG. 12, the deflectable contact 251a (deflectable contact 251h may have an identical configuration) has a fixed end 252a that is mounted in a metal-plated hole in the printed circuit board 230. Deflectable contact 251a includes a horizontally extending portion 253a that may mm along a top surface 232 of the printed circuit board 230, and that may protrude past a front edge 236 of the printed circuit board 230. Deflectable contact 251a may also include a bend section 254a, followed by another section 255a that leads to a distal end 256a of deflectable contact 251a. In some embodiments, the bend section 254a may be omitted so that sections 253a, 255a and 256a may comprise a single, longer, horizontal section.

As noted above, deflectable contact 251a is configured to make physical and electrical contact with jackwire contact 250a when a mating plug is inserted into the connector that includes assembly 220. Notably, as the deflectable contact 251a protrudes beyond the front edge 236 of the printed circuit board 230, when the mating plug forces contact 250a downward into mechanical and electrical contact with deflectable contact 251a, both jackwire contact 250a and deflectable contact 251a may extend below the top surface 232 of the printed circuit board 230. Thus, when the mating plug is inserted into the plug aperture, the deflectable contact 251a moves from an initial resting position to a deflected or "engaged" position. In this manner, the force exerted by the plug on jackwire contact 250a and on deflectable contact 251a may be absorbed along the full length of each respective contact, which may help protect the contact against permanent deformation. This may be particularly useful when, for example, an RJ-11 plug is inserted into an RJ-45 connector. Jackwire contact 251a may also include a bend section near its distal end that may increase the area over which jackwire contact 250a and deflectable contact 251a make mechanical contact.

While in the embodiment of FIGS. 11-12 deflectable contacts are only provided with respect to two of the jackwires, it will be appreciated that in other embodiments of the present invention as many as all eight of the jackwire contacts may have an associated deflectable contact. Moreover, some (or all) of the deflectable contacts (or portions thereof) may be part of the signal carrying path, while others (or all) may comprise part of dead end branches off of respective of the signal carrying paths through the connector.

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. A communications connector having a plurality of signal carrying paths, the communications connector comprising:
   a printed circuit board that includes a plurality of contact pads, a plurality of output terminals, and a plurality of conductive paths that connect at least some of the plurality of contact pads to respective ones of the plurality of output terminals; and
   a plurality of contacts, each contact having a plug contact region, a pad contact region that is arranged to mate with a respective one of the plurality of contact pads, and a signal carrying segment that connects the plug contact region and the pad contact region;
   wherein a first of the plurality of signal carrying paths extends from the plug contact region of a first of the plurality of contacts to a first of the plurality of output terminals;
   wherein the first of the plurality of signal carrying paths includes the signal carrying segment of the first of the plurality of contacts, a first of the plurality of contact pads and a first of the plurality of conductive paths; and
   wherein the signal carrying segment of the first of the plurality of contacts is staggered with respect to the signal carrying segment of another of the plurality of contacts that is directly adjacent to the first of the plurality of contacts.

2. The communications connector of claim 1, wherein the plurality of signal carrying paths comprises first, second, third, fourth, fifth, sixth, seventh and eighth signal carrying paths, wherein the fourth and fifth signal carrying paths comprise a first pair for carrying a first balanced signal, the first and second signal carrying paths comprise a second pair for carrying a second balanced signal, the third and sixth signal carrying paths comprise a third pair for carrying a third balanced signal, the seventh and eighth signal carrying paths comprise a fourth pair for carrying a fourth balanced signal, and wherein respective segments of the third and fifth signal carrying paths run directly adjacent each other to form an inductive crosstalk compensation stage.

3. The communications connector of claim 1, further comprising a housing having a plug aperture, a second plurality of contacts and a first deflectable contact that is mounted on the printed circuit board, wherein the first deflectable contact is configured to make contact with a first of the second plurality of contacts when a mating plug is received within the plug aperture.

4. The communications connector of claim 1, wherein the pad contact region of each of the plurality of contacts is located between a free end of the contact and the plug contact region.

5. The communications connector of claim 4, wherein each of the plurality of contacts includes a mounted end that is mounted in a respective one of a plurality of metal-plated holes in the printed circuit board, and wherein the printed circuit board includes a compensation circuit that is electrically connected by respective conductive traces to at least two of the plurality of metal-plated holes.

6. The communications connector of claim 5, wherein the compensating crosstalk introduced by the compensation circuit is introduced with substantially no delay relative to the plug contact regions of the ones of the plurality of contacts to which the compensation circuit is electrically connected.

7. The communications connector of claim 1, wherein each of the plurality of contacts includes a mounted end that is mounted in a respective one of a plurality of openings in a first surface of the printed circuit board, an intermediate segment that wraps around the printed circuit board, and a free end portion that extends above a second surface of the printed circuit board that is opposite the first surface.

8. The communications connector of claim 7, further comprising a second plurality of contacts, wherein each of the second plurality of contacts includes a mounted end that is mounted in a respective one of a second plurality of metal-plated holes in the second surface of the printed circuit board.

9. The communications connector of claim 7, wherein the pad contact region of each of the plurality of contacts is part of an undulation region of each respective contact.

10. A communications connector that includes a plurality of signal carrying paths that connect a plurality of input terminals to respective ones of a plurality of output terminals, the communications connector comprising:
a printed circuit board;
a plurality of wire connection terminals mounted on the printed circuit board;
a plurality of contacts, each of the plurality of contacts having a mounted end that is mounted in the printed circuit board, a free end, and a plug contact region;
wherein each of the plug contact regions comprises one of the plurality of input terminals and each of the wire connection terminals comprises one of the plurality of output terminals;
wherein at least some of the mounted ends comprise branches off of respective ones of the plurality of signal carrying paths, and
wherein a signal carrying segment of the first of the plurality of contacts is staggered with respect to the signal carrying segment of one of the plurality of contacts that is directly adjacent to the first of the plurality of contacts.

11. The communications connector of claim 10, wherein the mounted end of each contact is mounted in a respective one of a plurality of metal-plated holes in the printed circuit board, and wherein a crosstalk compensation circuit is connected to at least some of the metal-plated holes.

12. The communications connector of claim 10, wherein the printed circuit board further comprises a plurality of contact pads, and wherein each of the plurality of contacts further includes a pad contact region that is configured to mate with a respective one of the plurality of contact pads.

13. The communications connector of claim 10, wherein each of the plurality of contacts further includes a free end, and wherein the pad contact region of each contact is between the plug contact region of the contact and the free end of the contact.

14. The communications connector of claim 10, wherein the mounted end of each contact is mounted on a first surface of the printed circuit board, and wherein each contact wraps around the printed circuit board to extend above a second surface of the printed circuit board that is opposite the first side.

15. The communications connector of claim 10, wherein each of the plurality of contacts are disposed in a generally parallel side-by-side relationship with respect to the other of the plurality of contacts from the mounted end to the plug contact region of each contact.

16. The communications connector of claim 10, wherein each of the plurality of contacts wraps around a forward edge of the printed circuit board and is free-floating adjacent the forward edge of the printed circuit board.

17. A modular jack, comprising:
a printed circuit board that includes a plurality of contact pads, a plurality of output terminals, and a plurality of conductive paths that electrically connect at least some of the plurality of contact pads to respective ones of the plurality of output terminals; and
a plurality of contacts, each contact having a mounted end, a free end and an intermediate segment extending between the mounted end and the free end;
wherein each of the plurality of contact pads are mounted to make electrical contact with the intermediate segment of respective ones of the plurality of contacts when a plug is mated with the modular jack, and
wherein the intermediate segment of a first of the plurality of contacts is staggered with respect to the intermediate segment of a second of the plurality of contacts that is immediately adjacent the first of the plurality of contacts.

18. The modular jack of claim 17, wherein the intermediate segment of each contact includes a plug contact region, and wherein the plurality of contact pads make electrical contact with the respective ones of the plurality of contacts in between the plug contact region of each contact and the free end of each contact.

19. The modular jack of claim 17, wherein the mounted end of each of the plurality of contacts is mounted in respective ones of a plurality of metal-plated holes in the printed circuit board, and wherein the printed circuit board includes a compensation circuit that is electrically connected by respective conductive traces to at least two of the plurality of metal-plated holes.

20. The modular jack of claim 17, wherein at least some of the plurality of contacts wrap around a forward edge of the printed circuit board and are free-floating adjacent the forward edge of the printed circuit board.

* * * * *